United States Patent [19]
Saitoh et al.

[11] Patent Number: 4,585,721
[45] Date of Patent: Apr. 29, 1986

[54] PHOTOCONDUCTIVE MEMBER COMPRISING AMORPHOUS GERMANIUM, AMORPHOUS SILICON AND NITROGEN

[75] Inventors: Keishi Saitoh, Ibaraki; Yukihiko Ohnuki, Kawasaki; Shigeru Ohno, Yokohama, all of Japan

[73] Assignee: Canon Kabushiki Kaisha, Tokyo, Japan

[21] Appl. No.: 646,425

[22] Filed: Aug. 31, 1984

[30] Foreign Application Priority Data

| Sep. 5, 1983 | [JP] | Japan | 58-162725 |
| Sep. 6, 1983 | [JP] | Japan | 58-163433 |
| Sep. 12, 1983 | [JP] | Japan | 58-167746 |
| Sep. 12, 1983 | [JP] | Japan | 58-167750 |
| Oct. 14, 1983 | [JP] | Japan | 58-191985 |
| Oct. 21, 1983 | [JP] | Japan | 58-197331 |

[51] Int. Cl.$^4$ .............................................. G03G 5/08
[52] U.S. Cl. .................................... 430/84; 430/95
[58] Field of Search ........................ 430/84, 85, 86, 95

[56] References Cited

U.S. PATENT DOCUMENTS 4,490,450 12/1984 Shimizu et al. ........................ 430/85
4,490,453 12/1984 Shirai et al. ........................... 430/95

Primary Examiner—John L. Goodrow
Attorney, Agent, or Firm—Fitzpatrick, Cella, Harper & Scinto

[57] ABSTRACT

A photoconductive member comprises a substrate for photoconductive member and a light receiving layer provided on said substrate having a layer constitution in which a first layer region (G) comprising an amorphous material containing germanium atoms and a second layer region (S) exhibiting photoconductivity comprising an amorphous material containing silicon atoms are successively provided from the substrate side, said light receiving layer containing nitrogen atoms.

69 Claims, 12 Drawing Figures

PHOTOCONDUCTIVE MEMBER COMPRISING AMORPHOUS GERMANIUM, AMORPHOUS SILICON AND NITROGEN

BACKGROUND OF THE INVENTION

1. Field of the Invention

This invention relates to a photoconductive member having sensitivity to electromagnetic waves such as light (herein used in a broad sense, including ultraviolet rays, visible light, infrared rays, X-rays, gamma-rays, and the like).

2. Description of the Prior Art

Photoconductive materials, which constitute photoconductive layers in solid state image pickup devices, image forming members for electrophotography in the field of image formation, or manuscript reading devices and the like, are required to have a high sensitivity, a high SN ratio (photocurrent ($I_p$)/dark current ($I_d$)), spectral characteristics matching to those of electromagnetic waves to be irradiated, a rapid response to light, a desired dark resistance value as well as no harm to human bodies during usage. Further, in a solid state image pick-up device, it is also required that the residual image should easily be treated within a predetermined time. Particularly, in case of an image forming member for electrophotography to be assembled in an electrophotographic device to be used in an office as office apparatus, the aforesaid harmless characteristic is very important.

From the standpoint as mentioned above, amorphous silicon (hereinafter referred to as a-Si) has recently attracted attention as a photoconductive material. For example, German OLS Nos. 2746967 and 2855718 disclose applications of a-Si for use in image forming members for electrophotography, and German OLS No. 2933411 discloses an application of a-Si for use in a photoelectric transducing reading device.

However, under the present situation, the photoconductive members of the prior art having photoconductive layers constituted of a-Si are further required to be improved in a balance of overall characteristics including electrical, optical and photoconductive characteristics such as dark resistance value, photosensitivity and response to light, etc., and environmental characteristics during use such as humidity resistance, and further stability with the lapse of time.

For instance, when the above photoconductive member is applied in an image forming member for electrophotography, residual potential is frequently observed to remain during use thereof if improvements to higher photosensitivity and higher dark resistance are scheduled to be effected at the same time. When such a photoconductive member is repeatedly used for a long time, there will be caused various inconveniences such as accumulation of fatigues by repeated uses or so called ghost phenomenon wherein residual images are formed, or response characteristic will gradually be lowered when used at high speed repeatedly.

Further, a-Si has a relatively smaller coefficient of absorption of the light on the longer wavelength side in the visible light region as compared with that on the shorter wavelength side. Accordingly, in matching to the semiconductor laser practically applied at the present time, the light on the longer wavelength side cannot effectively be utilized, when employing a halogen lamp or a fluorescent lamp as the light source. Thus, various points remain to be improved.

On the other hand, when the light irradiated is not sufficiently absorbed in the photoconductive layer, but the amount of the light reaching the substrate is increased, interference due to multiple reflection may occur in the photoconductive layer to become a cause for "unfocused" image, in the case when the substrate itself has a high reflectance against the light transmitted through the photoconductive layer.

This effect will be increased, if the irradiated spot is made smaller for the purpose of enhancing resolution, thus posing a great problem in the case of using a semiconductor laser as the light source.

Further, a-Si materials to be used for constituting the photoconductive layer may contain as constituent atoms hydrogen atoms or halogen atoms such as fluorine atoms, chlorine atoms etc. for improving their electrical, photoconductive characteristics, boron atoms, phosphorus atoms, etc. for controlling the electroconduction type as well as other atoms for improving other characteristics. Depending on the manner in which these constituent atoms are contained, there may sometimes be caused problems with respect to electrical or photoconductive characteristics of the layer formed.

That is, for example, in many cases, the life of the photocarriers generated by light irradiation in the photoconductive layer formed is insufficient, or at the dark portion, the charges injected from the substrate side cannot sufficiently be impeded.

Further, when the layer thickness is as thick as ten and some microns or higher, there tend to occur such phenomena as loosening or peeling of layers off from the substrate surface or formation of cracks in the layers with lapse of time when left to stand in air after taking out from a vacuum deposition chamber for layer formation. These phenomenon will occur particularly frequently when the substrate is a drum-shaped substrate conventionally employed in the field of electrophotography. Thus, there are problems to be solved with respect to stability with lapse of time.

Accordingly, while attempting to improve the characteristics of a-Si material per se on one hand, it is also required to make efforts to overcome all the problems as mentioned above in designing of the photoconductive member on the other hand.

In view of the above points, the present invention contemplates the achievement obtained as a result of extensive studies made comprehensively from the standpoints of applicability and utility of a-Si as a photoconductive member for image forming members for electrophotography, solid state image pick-up devices, reading devices, etc. It has now been found that a photoconductive member having a layer constitution comprising a light receiving layer exhibiting photoconductivity, which comprises a-Si, especially an amorphous material containing at least one of hydrogen atom (H) and halogen atom (X) in a matrix of silicon atoms such as so called hydrogenated amorphous silicon, halogenated amorphous silicon or halogen-containing hydrogenated amorphous silicon (hereinafter referred to comprehensively as a-Si(H,X)), said photoconductive member being prepared by designing so as to have a specific structure as hereinafter described, not only exhibits practically extremely excellent characteristics but also surpass the photoconductive members of the prior art in substantially all respects, especially having markedly excellent characteristics as a photoconductive member for electrophotography and also excellent absorption spectrum characteristics on the longer wavelength side.

SUMMARY OF THE INVENTION

A primary object of the present invention is to provide a photoconductive member having electrical, optical and photoconductive characteristics which are constantly stable and all-environment type with virtually no dependence on the environments under use, which member is markedly excellent in photosensitive characteristics on the longer wavelength side and light fatigue resistance, and also excellent in durability without causing deterioration phenomenon when used repeatedly, exhibiting no or substantially no residual potential observed.

Another object of the present invention is to provide a photoconductive member which is high in photosensitivity throughout the whole visible light region, particularly excellent in matching to a semiconductor laser and also rapid in response to light.

Another object of the present invention is to provide a photoconductive member which is excellent in adhesion between a substrate and a layer provided on the substrate or between respective laminated layers, stable with closeness of structural arrangement and high in layer quality.

Still another object of the present invention is to provide a photoconductive member having sufficiently an ability to retain charges during charging treatment for formation of electrostatic images, when applied as a member for formation of an electrophotographic image and having excellent electrophotographic characteristics which is not substantially lowered even in a humid atmosphere, for which ordinary electrophotographic methods can very effectively be applied.

Further, still another object of the present invention is to provide a photoconductive member for electrophotography, which can easily provide an image of high quality which is high in density, clear in halftone, high in resolution and free from "unfocused" image.

Still another object of the present invention is to provide a photoconductive member having high photosensitivity and high SN ratio characteristic, and a good electrical contact with the substrate.

According to the present invention, there is provided a photoconductive member comprising a substrate for photoconductive member and a light receiving layer provided on said substrate having a layer constitution in which a first layer region (G) comprising an amorphous material containing germanium atoms and a second layer region (S) exhibiting photoconductivity comprising an amorphous material containing silicon atoms are successively provided from the substrate side, said light receiving layer containing nitrogen atoms.

DESCRIPTION OF THE PREFERRED EMBODIMENTS

Figure 1:
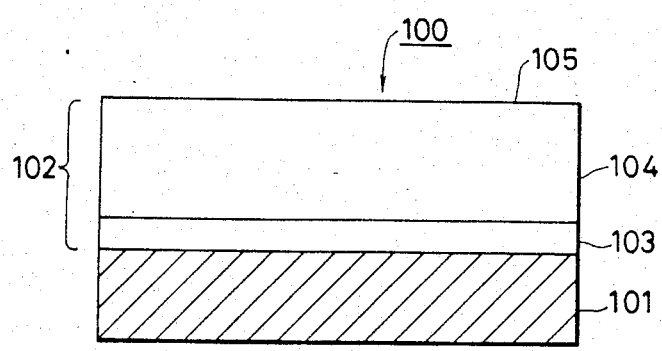
FIG. 1 and FIG. 11 each shows a schematic sectional view for illustration of the layer constitution of a preferred embodiment of the photoconductive member according to the present invention.

Referring now to the drawings, the photoconductive members according to the present invention are to be described in detail below.

FIG. 1 shows a schematic sectional view for illustration of the layer constitution of a first embodiment of the photoconductive member of this invention.

The photoconductive member 100 as shown in FIG. 1 is constituted of a light receiving layer 102 formed on a substrate 101 for photoconductive member, said light receiving layer 102 having a free surface 105 on one end surface.

The light receiving layer 102 has a layer structure constituted of a first layer region (G) 103 consisting of germanium atoms and, if desired, at least one of silicon atoms (Si), hydrogen atoms (H) and halogen atoms (X) (hereinafter abbreviated as "a-Ge(Si,H,X)" and a second layer region (S) 104 having photoconductivity consisting of a-Si(H,X) laminated successively from the substrate side 101.

In the case when germanium atoms are contained in the first layer region (G) 103 together with other atoms, germanium atoms are contained in said first layer region (G) 103 in such a distribution that they are distributed continuously and uniformly both in the layer thickness direction of said first layer region (G) 103 and in the interplanar direction in parallel to the surface of the substrate 101.

In the present invention, in the second layer region (S) provided on the first layer region (G), no germanium atom is contained, and by forming the light receiving layer to such a layer structure, it is possible to give a photoconductive member which is excellent in photosensitivity to the light over the entire wavelength region from relatively shorter wavelength to relatively longer wavelength including visible light region.

Also, since the distribution of germanium atoms in the first layer region (G) is such that germanium atoms are distributed continuously over all the layer region, affinity between the first layer region (G) and the second layer region (S) is excellent, and the light on the longer wavelength side which cannot substantially be absorbed by the second layer region (S) can be absorbed in the first layer region (G) substantially completely, when employing a semiconductor laser, whereby interference by reflection from the substrate surface can be prevented.

Also, in the photoconductive member of the present invention, when silicon atoms are contained in the first layer region (G) the respective light receiving materials constituting the first layer region (G) and the second layer region (S) have the common constituent of silicon atoms, and therefore chemical stability can be sufficiently ensured at the laminated interface.

In the present invention, the content of germanium atoms in the first layer region (G) containing germanium atoms, which may suitably be determined as desired so as to achieve effectively the objects of the present invention, may preferably be 1 to $10 \times 10^5$ atomic ppm, more preferably 100 to $9.5 \times 10^5$ atomic ppm, most preferably 500 to $8 \times 10^5$ atomic ppm based on the sum of germanium atoms and silicon atoms.

In the photoconductive member of the present invention, the layer thickness of the first layer region (G) and the thickness of the second layer region (S) are one of important factors for accomplishing effectively the object of the present invention and therefore sufficient care should be paid in designing of the photoconductive member so that desirable characteristics may be imparted to the photoconductive member formed.

In the present invention, the layer thickness $T_B$ of the first layer region (G) may preferably be 30 Å to 50μ, more preferably 40 Å to 40μ, most preferably 50 Å to 30μ.

On the other hand, the layer thickness T of the second layer region (S) may be preferably 0.5 to 90μ, more preferably 1 to 80μ, most preferably 2 to 50μ.

The sum of the layer thickness $T_B$ of the first layer region (G) and the layer thickness T of the second layer region (S), namely ($T_B$+T) may be suitably determined as desired in designing of the layers of the photoconductive member, based on the mutual organic relationship between the characteristics required for both layer regions and the characteristics required for the whole light receiving layer.

In the photoconductive member of the present invention, the numerical range for the above ($T_B$+T) may preferably be from 1 to 100μ, more preferably 1 to 80μ, most preferably 2 to 50μ.

In a more preferred embodiment of the present invention, it is preferred to select the numerical values for respective thicknesses $T_B$ and T as mentioned above so that the relation of $T_B/T \leq 1$ may be satisfied.

In selection of the numerical values for the thicknesses $T_B$ and T in the above case, the values of $T_B$ and T should preferably be determined so that the relation $T_B/T \leq 0.9$, most preferably, $T_B/T \leq 0.8$, may be satisfied.

In the present invention, when the content of germanium atoms in the first layer region (G) is $1 \times 10^5$ atomic ppm or more, based on the sum of germanium atoms and silicon atoms the layer thickness $T_B$ of the first layer region (G) should desirably be made as thin as possible, preferably 30μ or less, more preferably 25μ or less, most preferably 20μ or less.

In the photoconductive member of the present invention, for the purpose of improvements to higher photosensitivity, higher dark resistance and, further, improvement of adhesion between the substrate and the light receiving layer, nitrogen atoms are contained in the light receiving layer. The nitrogen atoms contained in the light receiving layer may be contained either evenly throughout the whole layer region of the light receiving layer or locally only in a part of the layer region of the light receiving layer.

Nitrogen atoms may be distributed in such a state that the content C(N) may be either uniform or ununiform in the layer thickness direction in the light receiving layer.

In the present invention, the layer region (N) containing nitrogen atoms provided in the light receiving layer is provided so as to occupy the whole layer region of the light receiving layer when it is intended to improve primarily photosensitivity and dark resistance. On the other hand, when the main object is to strengthen adhesion between the substrate and the light receiving layer, it is provided so as to occupy the end portion layer region (E) on the substrate side of the light receiving layer.

In the former case, the content of nitrogen atoms to be contained in the layer region (N) is made relatively smaller in order to maintain high photosensitivity, while in the latter case, it should desirably be made relatively larger in order to ensure strengthening of adhesion with the substrate.

For the purpose of accomplishing simultaneously both of the former and the latter cases, nitrogen atoms may be distributed at relatively higher content on the substrate side and at relatively lower content on the free surface side of the light receiving layer, or alternatively, there may be formed a distribution of nitrogen atoms such that nitrogen atoms are not positively contained in the surface layer region on the free surface side of the light receiving layer.

In the present invention, the content of nitrogen atoms to be contained in the layer region (N) provided in the light receiving layer may be suitably selected depending on the characteristics required for the layer region (N) per se or, when said layer region (N) is provided in direct contact with the substrate, depending on the organic relationship such the relation with the characteristics at the contacted interface with said substrate and others.

When another layer region is to be provided in direct contact with said layer region (N), the content of nitrogen atoms may be suitably selected also with considerations about the characteristics of said another layer region and the relation with the characteristics of the contacted interface with said another layer region.

The content of nitrogen atoms in the layer region (N), which may suitably be determined as desired depending on the characteristics required for the photoconductive member to be formed, may be preferably 0.001 to 50 atomic %, more preferably 0.002 to 40 atomic %, most preferably 0.003 to 30 atomic %.

In the present invention, when the layer region (N) comprises the whole region of the light receiving layer or when, although it does not comprises the whole layer region, the layer thickness ($T_N$) of the layer region (N) is sufficiently large relative to the layer thickness T of the light receiving layer, the upper limit of the content of nitrogen atoms in the layer region (N) should desirably be sufficiently smaller than the aforesaid value.

In the case of the present invention, in such a case when the ratio of the layer thickness ($T_N$) of the layer region (N) relative to the layer thickness T of the light receiving layer is 2/5 or higher, the upper limit of the content of nitrogen atoms in the layer region (N) may preferably be 30 atomic % or less, more preferably 20 atomic % or less, most preferably 10 atomic % or less.

FIGS. 2 through 10 show typical examples of distribution in the direction of layer thickness of nitrogen atoms contained in the layer region (N) of the photoconductive member in the present invention.

In FIGS. 2 through 10, the abscissa indicates the content C(N) of nitrogen atoms and the ordinate the layer thickness of the layer region (N), $t_B$ showing the position of the end surface of the layer region (N) on the substrate side and $t_T$ the position of the end surface of the layer region (N) on the side opposite to the substrate side. That is, layer formation of the layer region (N) containing nitrogen atoms proceeds from the $t_B$ side toward the $t_T$ side.

Figure 2:
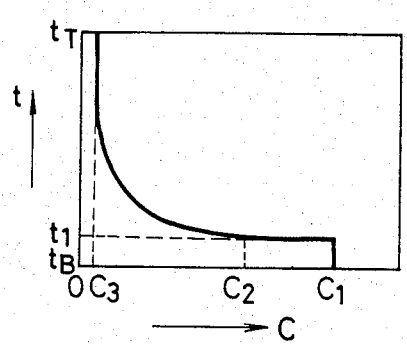
FIGS. 2 to 10 each shows a schematic illustration of the depth profile of nitrogen atoms in the layer region (N)

In FIG. 2, there is shown a first typical embodiment of the depth profile of nitrogen atoms in the layer thickness direction contained in the layer region (N).

In the embodiment as shown in FIG. 2, from the interface position $t_B$ at which the surface of the substrate, on which the layer region (N) containing nitrogen atoms is to be formed, is contacted with the surface of said layer region (N) to the position $t_1$, nitrogen atoms are contained in the layer region (N) formed, while the content C(N) of nitrogen atoms taking a constant value of $C_1$, the content being gradually decreased from the content $C_2$ continuously from the position $t_1$ to the interface position $t_T$. At the interface position $t_T$, the content C(N) of nitrogen atoms is made $C_3$.

Figure 3:
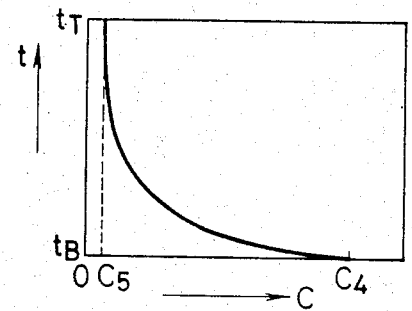

In the embodiment shown in FIG. 3, the content C(N) of nitrogen atoms contained is decreased gradually and continuously from the position $t_B$ to the position $t_T$ from the content $C_4$ until it becomes the content $C_5$ at the position $t_T$.

Figure 4:
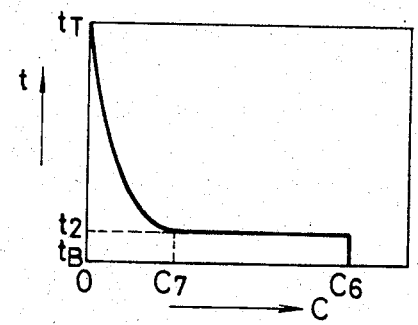

In case of FIG. 4, the content C(N) of nitrogen atoms is made constant as $C_6$ from the position $t_B$ to $t_2$, gradually decreased continuously from the position $t_2$ to the position $t_T$, and the content C(N) is made substantially zero at the position $t_T$ (substantially zero herein means the content less than the detectable limit).

Figure 5:
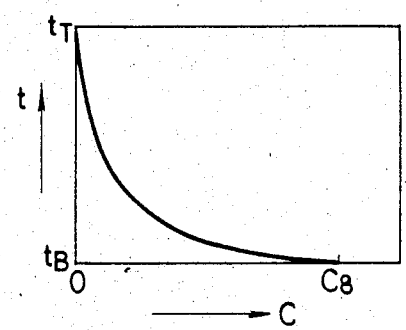

In case of FIG. 5, the content C(N) of nitrogen atoms are decreased gradually and continuously from the position $t_B$ to the position $t_T$ from the content $C_8$, until it is made substantially zero at the position $t_T$.

Figure 6:
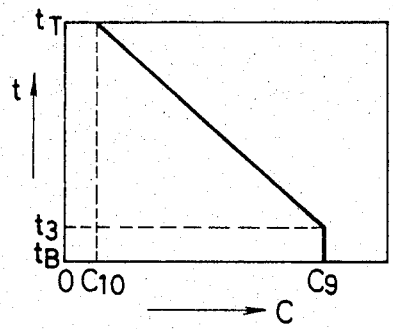

In the embodiment shown in FIG. 6, the content C(N) of nitrogen atoms is constantly $C_9$ between the position $t_B$ and the position $t_3$, and it is made $C_{10}$ at the position $t_T$. Between the position $t_3$ and the position $t_T$, the content is reduced as a first order function from the position $t_3$ to the position $t_T$.

Figure 7:
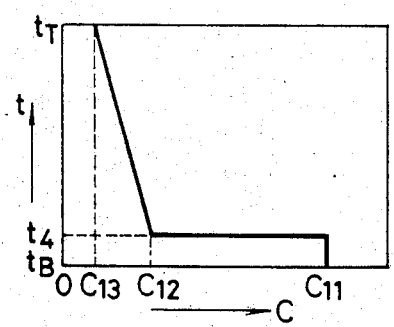

In the embodiment shown in FIG. 7, there is formed a depth profile such that the content C(N) takes a constant value of $C_{11}$ from the position $t_B$ to the position $t_4$, and is decreased as a first order function from the content $C_{12}$ to the content $C_{13}$ from the position $t_4$ to the position $t_T$.

Figure 8:
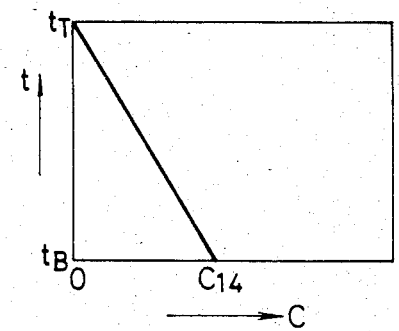

In the embodiment shown in FIG. 8, the content C(N) of nitrogen atoms is decreased as a first order function from the content $C_{14}$ to zero from the position $t_B$ to the position $t_T$.

Figure 9:
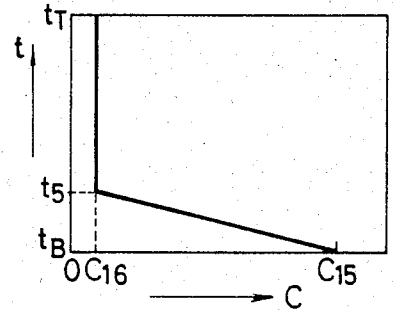

In FIG. 9, there is shown an embodiment, where the content C(N) of nitrogen atoms is decreased as a first order function from the content $C_{15}$ to $C_{16}$ from the position $t_B$ to $t_5$ and made constantly at the content $C_{16}$ between the position $t_5$ and $t_T$.

Figure 10:
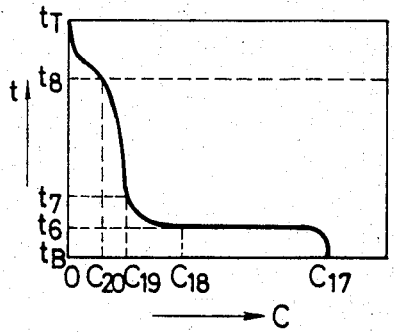

In the embodiment shown in FIG. 10, the content C(N) of nitrogen atoms is at the content $C_{17}$ at the position $t_B$, which content $C_{17}$ is initially decreased gradually and abruptly near the position $t_6$ to the position $t_6$, until it is made the content $C_{18}$ at the position $t_6$.

Between the position $t_6$ and the position $t_7$, the content C(N) is initially decreased abruptly and thereafter gradually, until it is made the content $C_{19}$ at the position $t_7$. Between the position $t_7$ and the position $t_8$, the content is decreased very gradually to the content $C_{20}$ at the position $t_8$. Between the position $t_8$ and the position $t_T$, the content is decreased along the curve having a shape as shown in the Figure from the content $C_{20}$ to substantially zero.

As described above about some typical examples of depth profiles of nitrogen atoms contained in the layer region (N) in the direction of the layer thickness by referring to FIGS. 2 through 10, in the present invention, the layer region (N) is provided desirably in a depth profile so as to have a portion enriched in content C(N) of nitrogen atoms on the substrate side and a portion depleted in content C(N) of nitrogen atoms to considerably lower than that of the substrate side on the interface $t_T$ side.

In the present invention, the layer region (N) containing nitrogen atoms for constituting the light receiving layer may preferably be provided so as to have a localized region (B) containing nitrogen atoms at a relatively higher content on the substrate side as described above, and in this case adhesion between the substrate and the light receiving layer can be further improved.

The localized region (B), as explained in terms of the symbols shown in FIGS. 2 to 10, may be desirably provided within 5μ from the interface position $t_B$.

In the present invention, the above localized region (B) may be made to be identical with the whole layer region $(L_T)$ up to the depth of 5μ thickness from the interface position $t_B$, or alternatively a part of the layer region $(L_T)$.

It may suitably be determined depending on the characteristics required for the light receiving layer to be formed, whether the localized region (B) is made a part or whole of the layer region $(L_T)$.

The localized region (B) may preferably formed according to such a layer formation that the maximum Cmax of the content C(N) of nitrogen atoms in a distribution in the layer thickness direction may preferably be 500 atomic ppm or more, more preferably 800 atomic ppm or more, most preferably 1000 atomic ppm or more.

That is, according to the present invention, the layer region (N) containing nitrogen atoms is formed so that the maximum value Cmax of the depth profile may exist within a layer thickness of 5μ from the substrate side (the layer region within 5μ thickness from $t_B$).

In the present invention, illustrative of halogen atoms (X), which may optionally be incorporated in the first layer region (G) and the second layer region (S) constituting the light receiving layer, are fluorine, chlorine, bromine and iodine, particularly preferably fluorine and chlorine.

In the present invention, formation of the first layer region (G) constituted of a-Ge(Si,H,X) may be conducted according to the vacuum deposition method utilizing discharging phenomenon, such as glow discharge method, sputtering method or ionplating method. For example, for formation of the first layer region (G) constituted of a-Ge(Si,H,X) according to the glow discharge method, the basic procedure comprises introducing a starting gas for Ge supply capable of supplying germanium atoms (Ge) optionally together with a starting gas for Si supply capable of supplying silicon atoms (Si), and a starting gas for introduction of hydrogen atoms (H) and/or a starting gas for introduction of halogen atoms (X) into a deposition chamber which can be internally brought to a reduced pressure, and exciting glow discharge in said deposition chamber, thereby effecting layer formation on the surface of a substrate placed at a predetermined position. For distributing ununiformly the germanium atoms in the first layer region (G), a layer consisting of a-Ge(Si,H,X) may be formed while controlling the depth profile of germanium atoms according to a desired change rate curve. Alternatively, for formation according to the sputtering method, when carrying out sputtering by use of a target constituted of Si or two sheets of targets of said target and a target constituted of Ge, or a target of a mixture of Si and Ge in an atmosphere of an inert gas such as Ar, He, etc. or a gas mixture based on these gases, a starting gas for Ge supply optionally diluted with He, Ar, etc. and optionally together with, if desired, a gas for introduction of hydrogen atoms (H) and/or a gas for introduction of halogen atoms (X) may be introduced into a deposition chamber for sputtering, thereby forming a plasma atmosphere of a desired gas, and sputtering of the aforesaid target may be effected, while controlling the gas flow rates of the starting gas for supply of Ge according to a desired change rate curve.

In the case of the ion-plating method, for example, a vaporizing source such as a polycrystalline silicon or a single crystalline silicon and a polycrystalline germanium or a single crystalline germanium may be placed as vaporizing source in an evaporating boat, and the vaporizing source is heated by the resistance heating method or the electron beam method (EB method) to be vaporized, and the flying vaporized product is permitted to pass through a desired gas plasma atmosphere, otherwise following the same procedure as in the case of sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the substances which can be starting gases for Ge supply, there may be effectively employed gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred with respect to easy handling during layer formation and efficiency for supplying Ge.

Effective starting gases for introduction of halogen atoms to be used in the present invention may include a large number of halogenic compounds, as exemplified preferably by gaseous or gasifiable halogenic compounds such as halogenic gases, halides, interhalogen compounds, silane derivatives substituted with halogens, and the like.

Further, there may also be included gaseous or gasifiable silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as BrF, ClF, $ClF_3$, $BrF_5$, $BrF_3$, $IF_3$, $IF_7$, ICl, IBr, etc.

As the silicon compounds containing halogen atoms, namely so called silane derivatives substituted with halogens, there may preferably be employed silicon halides such as $SiF_4$, $Si_2F_6$, $SiCl_4$, $SiBr_4$ and the like.

When the characteristic photoconductive member of the present invention is formed according to the glow discharge method by employment of such a silicon compound containing halogen atoms, it is possible to form the first layer region (G) comprising a-SiGe containing halogen atoms on a desired substrate without use of a hydrogenated silicon gas as the starting gas capable of supplying Si together with the starting gas for Ge supply.

In the case of forming the first layer region (G) containing halogen atoms according to the glow discharge method, the basic procedure comprises introducing, for example, a silicon halide as the starting gas for Si supply, a hydrogenated germanium as the starting gas for Ge supply and a gas such as Ar, $H_2$, He, etc. at a predetermined mixing ratio into the deposition chamber for formation of the first layer region (G) and exciting glow discharge to form a plasma atmosphere of these gases, whereby the first layer region (G) can be formed on a desired substrate. In order to control the ratio of hydrogen atoms incorporated more easily, hydrogen gas or a gas of a silicon compound containing hydrogen atoms may also be mixed with these gases in a desired amount to form the layer.

Also, each gas is not restricted to a single species, but multiple species may be available at any desired ratio.

In either case of the sputtering method and the ion-plating method, introduction of halogen atoms into the layer formed may be performed by introducing the gas of the above halogen compound or the above silicon compound containing halogen atoms into a deposition chamber and forming a plasma atmosphere of said gas.

On the other hand, for introduction of hydrogen atoms, a starting gas for introduction of hydrogen atoms, for example, $H_2$ or gases such as silanes and/or hydrogenated germanium as mentioned above, may be introduced into a deposition chamber for sputtering, followed by formation of the plasma atmosphere of said gases.

In the present invention, as the starting gas for introduction of halogen atoms, the halides or halo-containing silicon compounds as mentioned above can effectively be used. Otherwise, it is also possible to use effectively as the starting material for formation of the first layer region (G) gaseous or gasifiable substances, including halides containing hydrogen atom as one of the constituents, e.g. hydrogen halide such as HF, HCl, HBr, Hi, etc.; halo-substituted hydrogenated silicon such as $SiH_2F_2$, $SiH_2I_2$, $SiH_2Cl_2$, $SiHCl_3$, $SiH_2Br_2$, $SiHBr_3$, etc.; hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc.

Among these substances, halides containing hydrogen atoms can preferably be used as the starting material for introduction of halogen atoms, because hydrogen atoms, which are very effective for controlling electrical or photoelectric characteristics, can be introduced into the layer simultaneously with introduction of halogen atoms during formation of the first layer region (G).

For introducing hydrogen atoms structurally into the first layer region (G), other than those as mentioned above, $H_2$ or a hydrogenated silicon such as $SiH_4$, $Si_2H_6$, $Si_3H_8$, $Si_4H_{10}$, etc. together with germanium or a germanium compound for supplying Ge, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. together with silicon or a silicon compound for supplying Si can be permitted to co-exist in a deposition chamber, followed by excitation of discharging.

According to a preferred embodiment of the present invention, the amount of hydrogen atoms (H) or the amount of halogen atoms (X) or the sum of the amounts of hydrogen atoms and halogen atoms (H+X) to be contained in the first layer region (G) constituting the photoconductive layer to be formed should preferably be 0.01 to 40 atomic %, more preferably 0.05 to 30 atomic %, most preferably 0.1 to 25 atomic %.

For controlling the amount of hydrogen atoms (H) and/or halogen atoms (X) to be contained in the first layer region (G), for example, the substrate temperature and/or the amount of the starting materials used for incorporation of hydrogen atoms (H) or halogen atoms (X) to be introduced into the deposition device system, discharging power, etc. may be controlled.

In the present invention, for formation of the second layer region (S) constituted of a-Si(H,X), the starting materials (I) for formation of the first layer region (G), from which the starting material for the starting gas for supplying Ge is omitted, are used as the starting materials (II) for formation of the second layer region (S), and layer formation can be effected following the same procedure and conditions as in formation of the first layer region (G).

More specifically, in the present invention, formation of the second layer region (S) constituted of a-Si(H,X) may be carried out according to the vacuum deposition method utilizing discharging phenomenon such as the glow discharge method, the sputtering method or the ion-plating method. For example, for formation of the second layer region (S) constituted of a-Si(H,X), the basic procedure comprises introducing a starting gas for Si supply capable of supplying silicon atoms as described above, optionally together with starting gases for introduction of hydrogen atoms (H) and/or halogen atoms (X), into a deposition chamber which can be brought internally to a reduced pressure and exciting glow discharge in said deposition chamber, thereby forming a layer comprising a-Si(H,X) on a desired substrate placed at a predetermined position. Alternatively, for formation according to the sputtering method, gases for introduction of hydrogen atoms (H) and/or halogen atoms (X) may be introduced into a deposition chamber when effecting sputtering of a target constituted of Si in an inert gas such as Ar, He, etc. or a gas mixture based on these gases.

In the photoconductive member of the present invention, by incorporating a substance (C) for controlling conductivity in the second layer region (S) containing no germanium atom provided on the first layer region (G) containing germanium atoms, the conductivities of said layer region (S) can be controlled freely as desired.

As a substance (C) for controlling conductivity characteristics, there may be mentioned so called impurities in the field of semiconductors. In the present invention, there may be included p-type impurities giving p-type conductivity characteristics and n-type impurities giving n-type conductivity characteristics to a-Si(H,X) constituting the second layer region (S) formed.

More specifically, there may be mentioned as p-type impurities atoms belonging to the group III of the periodic table (Group III atoms), such as B (boron), Al (aluminum), Ga (gallium), In (indium), Tl (thallium), etc., particularly preferably B and Ga.

As n-type impurities, there may be included the atoms belonging to the group V of the periodic table (Group V atoms), such as P (phosphorus), As (arsenic), Sb (antimony), Bi (bismuth), etc., particularly preferably P and As.

In the present invention, the content of the substance (C) for controlling conductivity in the second layer region (S) may be suitably be selected depending on the conductivity required for said layer region (S), or the relationships with characteristics of other layer regions provided in direct contact with said layer region (S) or the characteristics at the contacted interface with said other layer regions.

In the present invention, the content of the substance (C) for controlling conductivity contained in the second layer region (S) should preferably be 0.001 to 1000 atomic ppm, more preferably 0.005 to 500 atomic ppm, most preferably 0.1-200 atomic ppm.

For incorporating a substance (C) for controlling conductivity such as the group III atoms or the group V atoms structurally into the second layer region (S), a starting material for introduction of the group III atoms or a starting material for introduction of the group V atoms may be introduced under gaseous state into a deposition chamber together with the starting materials for formation of the second layer region during layer formation. As the starting material which can be used for introduction of the group III atoms, it is desirable to use those which are gaseous at room temperature under atmospheric pressure or can readily be gasified at least under layer forming conditions. Typical examples of such starting materials for introduction of the group III atoms, there may be included as the compounds for introduction of boron atoms boron hydrides such as $B_2H_6$, $B_4H_{10}$, $B_5H_9$, $B_5H_{11}$, $B_6H_{10}$, $B_6H_{12}$, $B_6H_{14}$, etc. and boron halides such as $BF_3$, $BCl_3$, $BBr_3$, etc. Otherwise, it is also possible to use $AlCl_3$, $GaCl_3$, $Ga(CH_3)_3$, $InCl_3$, $TlCl_3$ and the like.

The starting materials which can effectively be used in the present invention for introduction of the group V atoms may include, for introduction of phosphorus atoms, phosphorus hydride such as $PH_3$, $P_2H_4$, etc., phosphorus halides such as $PH_4I$, $PF_3$, $PF_5$, $PCl_3$, $PCl_5$, $PBr_3$, $PBr_5$, $PI_3$ and the like. Otherwise, it is also possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$ and the like effectively as the starting material for introduction of the group V atoms.

In the present invention, for provision of the layer region (N) containing nitrogen atoms in the light receiving layer, a starting material for introduction of nitrogen atoms may be used together with the starting material for formation of the light receiving layer as mentioned above during formation of the light receiving layer and may be incorporated in the layer formed while controlling their amounts.

When the glow discharge method is to be employed for formation of the layer region (N), the starting material as the starting gas for formation of the layer region (N) may be constituted by adding a starting material for introduction of nitrogen atoms to the starting material selected as desired from those for formation of the light receiving layer as mentioned above. As such a starting material for introduction of nitrogen atoms, there may be employed most of gaseous or gasifiable substances containing at least nitrogen atoms as constituent atoms.

For example, there may be employed a mixture of a starting gas containing silicon atoms (Si) as constituent atoms, a starting gas containing nitrogen atoms (N) as constituent atoms and optionally a starting gas containing hydrogen atoms (H) and/or halogen atoms (X) as constituent atoms at a desired mixing ratio; a mixture of a starting gas containing silicon atoms (Si) as constituent atoms and a starting gas containing nitrogen atoms and hydrogen atoms as constituent atoms also at a desired mixing ratio.

Alternatively, there may also be employed a mixture of a starting gas containing silicon atoms (Si) and hydrogen atoms (H) as constituent atoms and a starting gas containing nitrogen atoms (N) as constituent atoms.

The starting material effectively used as the starting gas for introduction of nitrogen atoms (N) to be used during formation of the layer region (N), it is possible to use compounds containing N as constituent atom or compounds containing N and H as constituent atoms, such as gaseous or gasifiable nitrogen compounds, nitrides and azides, including for example, nitrogen ($N_2$), ammonia ($NH_3$), hydrazine ($H_2NNH_2$), hydrogen azide ($HN_3$), ammonium azide ($NH_4N_3$) and so on. Alternatively, for the advantage of introducing halogen atoms (X) in addition to nitrogen atoms (N), there may be also employed nitrogen halide compounds such as nitrogen trifluoride (F$_3$N), dinitrogen tetrafluoride (F$_4$N$_2$) and the like.

In the present invention, for further promoting the effect obtained by nitrogen atoms, it is possible to incorporate oxygen atoms in addition to nitrogen atoms in the layer region (N). The starting gas for introduction of oxygen atoms in the layer region may include, for example, oxygen (O$_2$), ozone (O$_3$), nitrogen monoxide (NO), nitrogen dioxide (NO$_2$), dinitrogen monoxide (N$_2$O), dinitrogen trioxide (N$_2$O$_3$), dinitrogen tetraoxide (N$_2$O$_4$), dinitrogen pentaoxide (N$_2$O$_5$), nitrogen trioxide (NO$_3$), and lower siloxanes containing silicon atoms (Si), oxygen atoms (O) and hydrogen atoms (H) as constituent atoms such as disiloxane (H$_3$SiOSiH$_3$), trisiloxane (H$_3$SiOSiH$_2$OSiH$_3$), and the like.

For formation of the layer region (N) containing nitrogen atoms according to the sputtering method, a single crystalline or polycrystalline Si wafer or Si$_3$N$_4$ wafer or a wafer containing Si and Si$_3$N$_4$ mixed therein may be employed and sputtering of these wafers may be conducted in various gas atmospheres.

For example, when Si wafer is employed as the target, a starting gas for introduction of nitrogen atoms optionally together with a starting gas for introduction of hydrogen atoms and/or halogen atoms, which may optionally be diluted with a diluting gas, may be introduced into a deposition chamber for sputtering to form gas plasma of these gases, in which sputtering of the aforesaid Si wafer may be effected.

Alternatively, by use of separate tragets of Si and Si$_3$N$_4$ or one sheet of a target containing Si and Si$_3$N$_4$ mixed therein, sputtering may be effected in an atmosphere of a diluting gas as a gas for sputtering or in a gas atmosphere containing at least hydrogen atoms (H) and/or halogen atoms (X) as constituent atoms. As the starting gas for introduction of nitrogen atoms, there may be employed the starting gases shown as examples in the glow discharge method previously described also as effective gases in case of sputtering.

In the present invention, when providing a layer region (N) containing nitrogen atoms during formation of the light receiving layer, formation of the layer region (N) having a desired distribution state in the direction of layer thickness (depth profile) by varying the content C(N) of nitrogen atoms contained in said layer region (N) may be conducted in case of glow discharge by introducing a starting gas for introduction of nitrogen atoms of which the content C(N) is to be varied into a deposition chamber, while varying suitably its gas flow rate according to a desired change rate curve. For example, by the manual method or any other method conventionally used such as an externally driven motor, etc., the opening of certain needle valve provided in the course of the gas flow channel system may be gradually varied. During this procedure, the rate of variation is not necessarily required to be linear, but the flow rate may be controlled according to a variation rate curve previously designed by means of, for example, a microcomputer to give a desired content curve.

In case when the layer region (N) is formed by the sputtering method, formation of a desired depth profile of nitrogen atoms in the direction of layer thickness by varying the content C(N) of nitrogen atoms in the direction of layer thickness may be performed first similarly as in case of the glow discharge method by employing a starting material for introduction of nitrogen atoms under gaseous state and varying suitably as desired the gas flow rate of said gas when introduced into the deposition chamber.

Secondly, formation of such a depth profile can also be achieved by previously changing the composition of a target for sputtering. For example, when a target comprising a mixture of Si and Si$_3$N$_4$ is to be used, the mixing ratio of Si to Si$_3$N$_4$ may be varied in the direction of layer thickness of the target.

In the present invention, the amount of hydrogen atoms (H) or the amount of halogen atoms (X) or the sum of the amounts of hydrogen atoms and halogen atoms (H+X) to be contained in the second layer region (S) constituting the light receiving layer to be formed should preferably be 1 to 40 atomic %, more preferably 5 to 30 atomic %, most preferably 5 to 25 atomic %.

The substrate to be used in the present invention may be either electroconductive material or insulating material. As the electroconductive material, there may be mentioned metals such as NiCr, stainless steel, Al, Cr, Mo, Au, Nb, Ta, V, Ti, Pt, Pd etc. or alloys thereof.

As the insulating material, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. These insulating substrates should preferably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, In$_2$O$_3$, SnO$_2$, ITO (In$_2$O$_3$+SnO$_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the photoconductive member 100 in FIG. 1 is to be used as an image forming member for electrophotography, it may desirably be formed into an endless belt or a cylinder for use in continuous high speed copying. The substrate may have a thickness, which is conveniently determined so that a photoconductive member as desired may be formed. When the photoconductive member is required to have a flexibility, the substrate is made as thin as possible, so far as the function of a substrate can be sufficiently exhibited. However, in such a case, the thickness is preferably 10$\mu$ or more from the points of fabrication and handling of the substrate as well as its mechanical strength.

Figure 11:
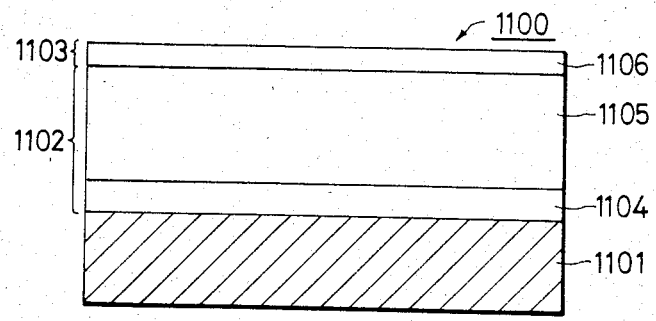

FIG. 11 shows a schematic illustration for explanation of the layer structure of the second embodiment of the photoconductive member of the present invention.

The photoconductive member 1100 shown in FIG. 11 has a substrate for photoconductive member 1101, and a first layer (I) 1102 and a second layer (II) 1103 provided on said substrate 1101, said second layer (II) 1103 having a free surface 1106 on one end surface.

The photoconductive member 1100 shown in FIG. 11 has the same constitution as the photoconductive member 100 shown in FIG. 1 except for having the second layer (II) 1103 laminated on the first layer (I) 1102 which corresponds to the light receiving layer 102.

That is, the substrate 1101, the first layer region (G) 1104, and the second layer region (S) 1105 correspond to the substrate 101, the first layer region (G) 103 and the second layer region (S) 104, respectively, and all the descriptions about these may be applicable similarly.

In the photoconductive member 100 shown in FIG. 1, the layer region (N) containing nitrogen atoms is provided in the light receiving layer 102 as described in detail above. This point is also applicable similarly to the photoconductive member 1101 shown in FIG. 11.

The above amorphous material constituting the second layer (II) may include an amorphous material containing silicon atoms (Si) and carbon atoms (C), optionally together with hydrogen atoms (H) and/or halogen atoms (X) (hereinafter written as "a-$(Si_xC_{1-x})y(H,X)1-y$", wherein $0<x$, $y<1$) and an amorphous material containing silicon atoms (Si) and oxygen atoms (O), optionally together with hydrogen atoms (H) and/or halogen atoms (X) (hereinafter written as "a-$(Si_xO_{1-x})y(H,X)1-y$", wherein $0<x$, $y<1$).

Thus, in the photoconductive member 1100 with the layer structure shown in FIG. 11, the respective amorphous materials constituting the first layer (I) 1102 and the second layer (II) 1103 have the common constituent of silicon atom, and therefore chemical stability is sufficiently ensured at the laminated interface.

Formation of the second amorphous layer (II) constituted of these amorphous materials may be performed according to the glow discharge method, the sputtering method, the ion-implantation method, the ion-plating method, the electron beam method, etc. These preparation methods may be suitably selected depending on various factors such as the preparation conditions, the extent of the load for capital investment for installations, the production scale, the desirable characteristics required for the photoconductive member to be prepared, etc. For the advantages of relatively easy control of the preparation conditions for preparing photoconductive members having desired characteristics and easy introduction of carbon atoms and/or oxygen atoms, hydrogen atoms and/or halogen atoms with silicon atoms (Si) into the second layer (II) to be prepared, there may preferably be employed the glow discharge method or the sputtering method.

Further, in the present invention, the glow discharge method and the sputtering method may be used in combination in the same device system to form the second layer (II).

For formation of the second layer (II) according to the glow discharge method, starting gases for formation of amorphous material constituting the second layer (II), which may optionally be mixed with a diluting gas at a predetermined mixing ratio, may be introduced into a deposition chamber for vacuum deposition in which a substrate is placed, and glow discharge is excited in said deposition chamber to form the gases introduced into a gas plasma, thereby depositing amorphous material for formation of the second layer (II) on the first layer (I) already formed on the substrate.

In the present invention, as starting gases for formation of a-$(Si_xC_{1-x})y(H,X)1-y$, there may be employed most of substances containing at least one of silicon atoms (Si), carbon atoms (C), hydrogen atoms (H) and halogen atoms (X) as constituent atoms which are gaseous or gasified substances of readily gasifiable ones.

For example, it is possible to use a mixture of a starting gas containing Si as constituent atom, a starting gas containing C as constituent atom and optionally a starting gas containing H as constituent atom and/or a starting gas containing X as constituent atom at a desired mixing ratio, or a mixture of a starting gas containing Si as constituent atom and a starting gas containing C and H as constituent atoms and/or a starting gas containing C and X as constituent atoms also at a desired ratio, or a mixture of a starting gas containing Si as constituent atom and a starting gas containing three constituent atoms of Si, C and H or a starting gas containing three constituent atoms of Si, C and X.

Alternatively, it is also possible to use a mixture of a starting gas containing Si and H as constituent atoms with a starting gas containing C as constituent atom or a mixture of a starting gas containing Si and X as constituent atoms and a starting gas containing C as constituent atom.

In the present invention, as starting gases for formation of a-$(Si_xO_{1-x})y(H,X)1-y$, there may be employed most of substances containing at least one of silicon atoms (Si), oxygen atoms (O), hydrogen atoms (H) and halogen atoms (X) as constituent atoms which are gaseous or gasified substances of readily gasifiable ones.

For example, it is possible to use a mixture of a starting gas containing Si as constituent atom, a starting gas containing O as constituent atom and optionally a starting gas containing H as constituent atom and/or a starting gas containing X as constituent atom at a desired mixing ratio, or a mixture of a starting gas containing Si as constituent atom and a starting gas containing O and H as constituent atoms and/or a starting gas containing O and X as constituent atoms also at a desired ratio, or a mixture of a starting gas containing Si as constituent atom and a starting gas containing three constituent atoms of Si, O and H or a starting gas containing three constituent atoms of Si, O and X.

Alternatively, it is also possible to use a mixture of a starting gas containing Si and H as constituent atoms with a starting gas containing O as constituent atom or a mixture of a starting gas containing Si and X as constituent atoms and a starting gas containing O as constituent atom.

In the present invention, suitable halogen atoms (X) contained in the second layer (II) are F, Cl, Br and I, particularly preferably F and Cl.

In the present invention, the starting gas which can be effectively used for formation of the second layer (II) may include those which are gaseous under conditions of room temperature and atmospheric pressure or can be readily gasified.

Formation of the second layer (II) according to the sputtering method may be practiced as follows.

In the first place, when a target constituted of Si is subjected to sputtering in an atmosphere of an inert gas such as Ar, He, etc. or a gas mixture based on these gases, a starting gas for introduction of carbon atoms (C) and/or a starting gas for introduction of oxygen atoms (O) may be introduced, optionally together with starting gases for introduction of hydrogen atoms (H) and/or halogen atoms (X), into a vacuum deposition chamber for carrying out sputtering.

In the second place, carbon atoms (C) and/or oxygen atoms (O) can be introduced into the second layer (II) formed by the use of a target constituted of $SiO_2$ or graphite, or two sheets of a target constituted of Si and a target constituted of $SiO_2$ and/or graphite or a target constituted of Si and $SiO_2$ and/or graphite. In this case, if the starting gas for introduction of carbon atoms (C) and/or the starting gas for introduction of oxygen atoms (O) as mentioned above is used in combination, the amount of carbon atoms (C) and/or oxygen atoms (O) to be incorporated in the second layer (II) can easily be controlled as desired by controlling the flow rate thereof.

The amount of carbon atoms (C) and/or oxygen atoms (O) to be incorporated into the second layer (II) can be controlled as desired by controlling the flow rate of the starting gas for introduction of carbon atoms (C) and/or the starting gas for introduction of oxygen atoms (O), adjusting the ratio of carbon atoms (C) and/or oxygen atoms (O) in the target for introduction of carbon atoms and/or oxygen atoms during preparation of the target, or performing both of these.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

By the use of these starting materials, H can also be incorporated together with Si in the second layer (II) formed by adequate choice of the layer forming conditions.

As the starting materials effectively used for supplying Si, in addition to the hydrogenated silicons as mentioned above, there may be included silicon compounds containing halogen atoms (X), namely the so called silane derivatives substituted with halogen atoms, including silicon halogenide such as $SiF_4$, $Si_2F_6$, $SiCl_4$, $SiBr_4$, $SiCl_3Br$, $SiCl_2Br_2$, $SiClBr_3$, $SiCl_3I$, etc., as preferable ones.

Further, halides containing hydrogen atoms as one of the constituents, which are gaseous or gasifiable, such as halo-substituted hydrogenated silicon, including $SiH_2F_2$, $SiH_2I_2$, $SiH_2Cl_2$, $SiHCl_3$, $SiH_3Br$, $SiH_2Br_2$, $SiHBr_3$, etc. may also be mentioned as the effective starting materials for supplying Si for formation of the second layer (II).

Also, in the case of employing a silicon compound containing halogen atoms (X), X can be introduced together with Si in the second layer (II) formed by suitable choice of the layer forming conditions as mentioned above.

Among the starting materials described above, silicon halogenide compounds containing hydrogen atoms are used as preferable starting material for introduction of halogen atoms (X) in the present invention since, during the formation of the second layer (II), hydrogen atoms (H), which are extremely effective for controlling electrical or photoelectric characteristics, can be incorporated together with halogen atoms (X) into the layer.

Effective starting materials to be used as the starting gases for introduction of halogen atoms (X) in formation of the second layer (II) in the present invention, there may be included, in addition to those as mentioned above, for example, halogen gases such as fluorine, chlorine, bromine and iodine; interhalogen compounds such as BrF, ClF, $ClF_3$, $BrF_5$, $BrF_3$, $IF_3$, $IF_7$, ICl, IBr, etc. and hydrogen halide such as HF, HCl, HBr, HI, etc.

The starting gas for introduction of carbon atoms (C) to be used in formation of the second layer (II) may include compounds containing C and H as constituent atoms such as saturated hydrocarbons containing 1 to 4 carbon atoms, ethylenic hydrocarbons having 2 to 4 carbon atoms, acetylenic hydrocarbons having 2 to 3 carbons atoms, etc.

More specifically, there may be included, as saturated hydrocarbons, methane ($CH_4$), ethane ($C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2 ($C_4H_8$), isobutylene ($C_4H_8$), pentene ($C_5H_{10}$); as acetylenic hydrocarbons, acetylene ($C_2H_2$), methyl acetylene ($C_3H_4$), butyne ($C_4H_6$).

Otherwise, it is also possible to use halosubstituted paraffinic hydrocarbons such as $CF_4$, $CCl_4$, $CBr_4$, $CHF_3$, $CH_2F_2$, $CH_3F$, $CH_3Cl$, $CH_3Br$, $CH_3I$, $C_2H_5Cl$, etc.; fluorinated sulfur compounds such as $SF_4$, $SF_6$, etc.; silane derivatives, including alkyl silanes such as $Si(CH_3)_4$, $Si(C_2H_5)_4$, etc. and halocontaining alkyl silanes such as $SiCl(CH_3)_3$, $SiCl_2(CH_3)_2$, $SiCl_3CH_3$, etc. as effective ones.

The starting materials for formation of the above second layer (II) may be selected and employed as desired in formation of the second layer (II) so that silicon atoms, and carbon atoms and/or oxygen atoms, optionally together with hydrogen atoms and/or halogen atoms may be contained at a predetermined composition ratio in the second layer (II) to be formed.

For example, $Si(CH_3)_4$ as the material capable of incorporating easily silicon atoms, carbon atoms and hydrogen atoms and forming a layer having desired characteristics and $SiHCl_3$, $SiCl_4$, $SiH_2Cl_2$ or $SiH_3Cl$ as the material for incorporating halogen atoms may be mixed at a predetermined mixing ratio and introduced under gaseous state into a device for formation of a second layer (II), followed by excitation of glow discharge, whereby there can be formed a second layer (II) comprising a-$(Si_xC_{1-x})y(Cl+H)_{1-y}$.

The starting material effectively used as the starting gas for introduction of oxygen atoms (O) to be used during formation of the second layer (II), it is possible to use compounds containing O as constituent atom or compounds containing N and O as constituent atoms, such as oxygen ($O_2$), ozone ($O_3$), nitrogen monoxide (NO), nitrogen dioxide ($NO_2$), dinitrogen monoxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$), and lower siloxanes containing silicon atoms (Si), oxygen atoms (O) and hydrogen atoms (H) as constituent atoms such as disiloxane ($H_3SiOSiH_3$), trisiloxane ($H_3SiOSiH_2OSiH_3$), and the like.

In the present invention, as the diluting gas to be used in formation of the second layer (II) by the glow discharge method or the sputtering method, there may be included the so called rare gases such as He, Ne and Ar as preferable ones.

The second layer (II) in the present invention should be carefully formed so that the required characteristics may be given exactly as desired.

That is, the above material containing Si, and C and/or O, optionally together with H and/or X as constituent atoms can take various forms from crystalline to amorphous and show electrical properties from conductive through semiconductive to insulating and photoconductive properties from photoconductive to non-photoconductive depending on the preparation conditions. Therefore, in the present invention, the preparation conditions are strictly selected as desired so that there may be formed the amorphous material for constitution of the second layer (II) having desired characteristics depending on the purpose. For example, when the second layer (II) is to be provided primarily for the purpose of improvement of dielectric strength, the aforesaid amorphous material is prepared as an amorphous material having marked electric insulating behaviours under the use environment.

Alternatively, when the primary purpose for provision of the second layer (II) is improvement of continuous repeated use characteristics or environmental use characteristics, the degree of the above electric insulating property may be alleviated to some extent and the aforesaid amorphous material may be prepared as an amorphous material having sensitivity to some extent to the light irradiated.

In forming the second layer (II) consisting of the aforesaid amorphous material on the surface of the first layer (I), the substrate temperature during layer formation is an important factor having influences on the structure and the characteristics of the layer to be formed, and it is desired in the present invention to control severely the substrate temperature during layer formation so that the second layer (II) having intended characteristics may be prepared as desired.

As the substrate temperature in forming the second layer (II) for accomplishing effectively the objects in the present invention, there may be selected suitably the optimum temperature range in conformity with the method for forming the second layer (II) in carrying out formation of the second layer (II), preferably 20° to 400° C., more preferably 50° to 350° C., most preferably 100° to 300° C. For formation of the second layer (II), the glow discharge method or the sputtering method may be advantageously adopted, because severe control of the composition ratio of atoms constituting the layer or control of layer thickness can be conducted with relative ease as compared with other methods. In case when the second layer (II) is to be formed according to these layer forming methods, the discharging power during layer formation is one of important factors influencing the characteristics of the above amorphous material constituting the second layer (II) to be prepared, similarly as the aforesaid substrate temperature.

The discharging power condition for preparing effectively the amorphous material for constitution of the second layer (II) having characteristics for accomplishing the objects of the present invention with good productivity may preferably be 1.0 to 300 W, more preferably 2.0 to 250 W, most preferably 5.0 to 200 W.

The gas pressure in a deposition chamber may preferably be 0.01 to 1 Torr, more preferably 0.1 to 0.5 Torr.

In the present invention, the above numerical ranges may be mentioned as preferable numerical ranges for the substrate temperature, discharging power for preparation of the second layer (II). However, these factors for layer formation should not be determined separately independently of each other, but it is desirable that the optimum values of respective layer forming factors should be determined based on mutual organic relationships so that the second layer (II) having desired characteristics may be formed.

The respective contents of carbon atoms, oxygen atoms or both thereof in the second layer (II) in the photoconductive member of the present invention are important factors for obtaining the desired characteristics to accomplish the objects of the present invention, similarly as the conditions for preparation of the second layer (II). The respective contents of carbon atoms and/or oxygen atoms contained in the second layer (II) in the present invention are determined as desired depending on the amorphous material constituting the second layer (II) and its characteristics.

More specifically, the amorphous material represented by the above formula a-$(Si_xC_{1-x})_y(H,X)_{1-y}$ may be broadly classified into an amorphous material constituted of silicon atoms and carbon atoms (hereinafter) written as "a-$Si_aC_{1-a}$", where $0<a<1$), an amorphous material constituted of silicon atoms, carbon atoms and hydrogen atoms (hereinafter written as a-$(Si_bC_{1-b})_cH_{1-c}$, where $0<b$, $c<1$) and an amorphous material constituted of silicon atoms, carbon atoms, halogen atoms and optionally hydrogen atoms (hereinafter written as "a-$(Si_dC_{1-d})_e(H,X)_{1-e}$", where $0<d$, $e<1$).

In the present invention, when the second layer (II) is to be constituted of a-$Si_aC_{1-a}$, the content of carbon atoms in the second layer (II) may generally be $1\times10^{-3}$ to 90 atomic %, more preferably 1 to 80 atomic %, most preferably 10 to 75 atomic %, namely in terms of representation by a in the above a-$Si_aC_{1-a}$, a being preferably 0.1 to 0.99999, more preferably 0.2 to 0.99, most preferably 0.25 to 0.9.

In the present invention, when the second layer (II) is to be constituted of a-$(Si_bC_{1-b})_cH_{1-c}$, the content of carbon atoms in the second layer (II) may preferably be $1\times10^{-3}$ to 90 atomic %, more preferably 1 to 90 atomic %, most preferably 10 to 80 atomic %, the content of hydrogen atoms preferably 1 to 40 atomic %, more preferably 2 to 35 atomic %, most preferably 5 to 30 atomic %, and the photoconductive member formed when the hydrogen content is within these ranges can be sufficiently applicable as excellent one in practical aspect.

That is, in terms of the representation by the above a-$(Si_bC_{1-b})_cH_{1-c}$, b should preferably be 0.1 to 0.99999, more preferably 0.1 to 0.99, most preferably 0.2 to 0.9, and c preferably 0.6 to 0.99, more preferably 0.65 to 0.98, most preferably 0.7 to 0.95.

When the second layer (II) to be constituted of a-$(Si_dC_{1-d})_e(H,X)_{1-e}$, the content of carbon atoms in the second layer (II) may preferably be $1\times10^{-3}$ to 90 atomic %, more preferably 1 to 90 atomic %, most preferably 10 to 85 atomic %, the content of halogen atoms preferably 1 to 20 atomic %, more preferably 1 to 18 atomic %, most preferably 2 to 15 atomic %. When the content of halogen atoms is within these ranges, the photoconductive member prepared is sufficiently applicable in practical aspect. The content of hydrogen atoms optionally contained may preferably be 19 atomic % or less, more preferably 13 atomic % or less.

That is in terms of representation by d and e in the above a-$(Si_dC_{1-d})_e(H,X)_{1-e}$, d should preferably be 0.1 to 0.99999, more preferably 0.1 to 0.99, most preferably 0.15 to 0.9, and e preferably 0.8 to 0.99, more preferably 0.82 to 0.99, most preferably 0.85 to 0.98.

On the other hand, the amorphous material represented by the above formula a-$(Si_xO_{1-x})_y(H,X)_{1-y}$ may be broadly classified into an amorphous material constituted of silicon atoms and oxygen atoms (hereinafter written as "a-$Si_aO_{1-a}$", where $0<a<1$), an amorphous material constituted of silicon atoms, oxygen atoms and hydrogen atoms (hereinafter written as a-$(Si_bO_{1-b})_cH_{1-c}$, where $0<b$, $c<1$) and an amorphous material constituted of silicon atoms, oxygen atoms, halogen atoms and optionally hydrogen atoms (hereinafter written as "a-$(Si_dO_{1-d})_e(H,X)_{1-e}$", where $0<d$, $e<1$).

In the present invention, when the second layer (II) is to be constituted of a-$Si_aO_{1-a}$, the content of oxygen atoms in the second layer (II) may preferably be 0.33 to 0.99999, more preferably 0.5 to 0.99, most preferably 0.6 to 0.9, in terms of a in the above formula a-$Si_aO_{1-a}$.

In the present invention, when the second layer (II) is to be constituted of a-$(Si_bO_{1-b})_cH_{1-c}$, the content of oxygen atoms may preferably be such that b in the above formula a-$(Si_bO_{1-b})_cH_{1-c}$ may preferably be 0.33 to 0.99999, more preferably be 0.5 to 0.9, most preferably 0.6 to 0.9, and c preferably 0.6 to 0.99, more preferably 0.65 to 0.98, most preferably 0.7 to 0.95.

When the second layer (II) is to be constituted of a-$(Si_dO_{1-d})_e(H,X)_{1-e}$, the content of oxygen atoms may preferably be such that d in the above formula a-$(Si_dO_{1-d})_e(H,X)_{1-e}$ may preferably be 0.33 to 0.99999, more preferably be 0.5 to 0.99, most preferably 0.6 to 0.9, and e preferably 0.8 to 0.99, more preferably 0.82 to 0.99, most preferably 0.85 to 0.98.

The range of the numerical value of layer thickness of the second layer (II) should desirably be determined depending on the intended purpose so as to effectively accomplish the objects of the present invention.

The layer thickness of the second layer (II) is also required to be determined as desired suitably with due considerations about the relationships with the contents of oxygen atoms, the relationship with the layer thickness of the first layer (I), as well as other organic relationships with the characteristics required for respective layer regions.

In addition, it is also desirable to have considerations from econimical point of view such as productivity or capability of bulk production.

The second layer (II) in the present invention is desired to have a layer thickness preferably of 0.003 to 30$\mu$, more preferably 0.004 to 20$\mu$, most preferably 0.005 to 10$\mu$.

In the photoconductive member of the present invention, desired conductivity characteristic may be imparted to the first layer region (G) by incorporating a substance (C) for controlling conductivity as described above in the first layer region (G).

The substance (C) for controlling conductivity to be incorporated in the first layer region (G) may be contained in the first layer region (G) either evenly throughout the whole layer region or locally in a part of the layer region (G).

In the present invention, when the substance (C) for controlling conductivity is contained in the first layer region (G) so as to exist locally in a part of the layer region (G), the layer region (PN) containing said substance (C) should desirably be provided as the end layer region of the first layer region (G). In particular, when the said layer region (PN) is provided as the end layer region on the substrate side of the first layer region (G), it is possible to inhibit effectively injection of charges of a specific polarity from the substrate into the light receiving layer by selecting adequately the aforesaid substance (C) to be contained in the layer region (PN) and its amount as desired.

In the present invention, when the substance (C) for controlling conductivity is contained in the first layer region (G) constituting a part of the light receiving layer evenly throughout the whole region or locally in the layer thickness direction, it is further possible to incorporate the above substance (C) in the second layer region (S) which is provided on the first layer region (G).

When the above substance (C) is contained in the second layer region (S), the substance (C) to be contained in the second layer region (S), its amount and the manner in which it is contained may suitably be determined depending on the substance (C) contained in the first layer region (G), its amount and the manner in which it is contained.

In the present invention, when the above substance (C) is contained in the second layer region (S), it is preferred that the above substance (C) should be contained at least on the layer region including the contacted interface with the first layer region (G).

Otherwise, the above substance (C) may also be contained in the second layer region (S) evenly throughout the whole region or alternatively uniformly only in a part of the layer region.

Thus, when the substance (C) for controlling conductivity is contained in both of the first layer region (G) and the second layer region (S), it is desirable that the layer region containing the above substance (C) in the first layer region (G) and the layer region containing the above substance (C) in the second layer region (S) should be provided so as to be in contact with each other. The substance (C) contained in the first layer region (G) and that in the second layer region (S) may be of the same species or different, and their amounts may also be the same or different in respective layer regions.

However, in the case when the above substance (C) contained in the respective regions is of the same kind, it is preferable to increase sufficiently the content in the first layer region (G) or to incorporate substances with different electrical characteristics in respective desired layer regions.

Thus, in the present invention, by provision of a layer region (PN) containing a substance (C) for controlling conductivity by incorporating the substance (C) in the first layer region (G) and/or the second layer region (S), the conductivity characteristic can be controlled as desired, but its content should desirably be determined as follows.

That is, in the present invention, the content of the substance (C) for controlling conductivity in the layer region (PN) may be suitably be selected depending on the conductivity required for said layer region (PN), or the relationships with characteristics of other layer regions provided in direct contact with said layer region (PN) or the characteristics at the contacted interface with said other layer regions.

In the present invention, the content of the substance (C) for controlling conductivity contained in the layer region (PN) should preferably be 0.01 to $5 \times 10^4$ atomic ppm, more preferably 0.5 to $1 \times 10^4$ atomic ppm, most preferably 1 to $5 \times 10^3$ atomic ppm.

In the present invention, by making the content of the substance (C) for controlling conductivity in the layer region (PN) preferably 30 atomic ppm or more, more preferably 50 atomic ppm or more, most preferably 100 atomic ppm or more, for example, in the case when said substance to be incorporated is a p-type impurity as mentioned above, migration of electrons injected from the substrate side into the light receiving layer can be effectively inhibited when the free surface of the light receiving layer is subjected to the charging treatment to $\oplus$ polarity. On the other hand, when the substance to be incorporated is a n-type impurity, migration of positive holes injected from the substrate side into the light receiving layer can be effectively inhibited when the free surface of the light receiving layer is subjected to the charging treatment to ⊖ polarity.

In the case as mentioned above, the layer region (Z) at the portion excluding the above layer region (PN) as described above may contain a substance for controlling conductivity of the other polarity, or a substance for controlling conductivity characteristics of the same polarity may be contained therein in an amount by far smaller than that practically contained in the layer region (PN).

In such a case, the content of the substance (C) for controlling conductivity contained in the above layer region (Z) can be determined adequately as desired depending on the polarity or the content of the substance contained in the layer region (PN), but it is preferably 0.001 to 1000 atomic ppm, more preferably 0.05 to 500 atomic ppm, most preferably 0.1 to 200 atomic ppm.

In the present invention, when the same kind of a substance for controlling conductivity is contained in the layer region (PN) and the layer region (Z), the content in the layer region (Z) should preferably be 30 atomic ppm or less.

In the present invention, it is also possible to provide a layer region containing a substance for controlling conductivity having one polarity and a layer region containing a substance for controlling conductivity having the other polarity in direct contact with each other, thus providing a so called depletion layer at said contact region. In short, for example, a layer region containing the aforesaid p-type impurity and a layer region containing the aforesaid n-type impurity are provided in the light receiving layer in direct contact with each other to form the so called p-n junction, whereby a depletion layer can be provided.

The photoconductive member of the present invention designed to have such a layer constitution as described in detail above can solve all of the various problems as mentioned above and exhibit very excellent electrical, optical, photoconductive characteristics, dielectric strength and use environment characteristics.

In particular, the photoconductive member of the present invention is free from any influence from residual potential on image formation when applied for an image forming member for electrophotography, with its electrical characteristics being stable with high sensitivity, having a high SN ratio as well as excellent light fatigue resistance and excellent repeated use characteristic and being capable of providing images of high quality of high density, clear halftone and high resolution repeatedly and stably.

Also, in the photoconductive member of the present invention, the first layer formed on the substrate is itself tough and markedly excellent in adhesion to the substrate, and therefore it can be used continuously repeatedly at high speed for a long time.

Further, the photoconductive member of the present invention is high in photosensitivity over all the visible light region, particularly excellent in matching to semiconductor laser, excellent in interference inhibition and rapid in response to light.

Next, an example of the process for producing the photoconductive member of this invention is to be briefly described.

Figure 12:
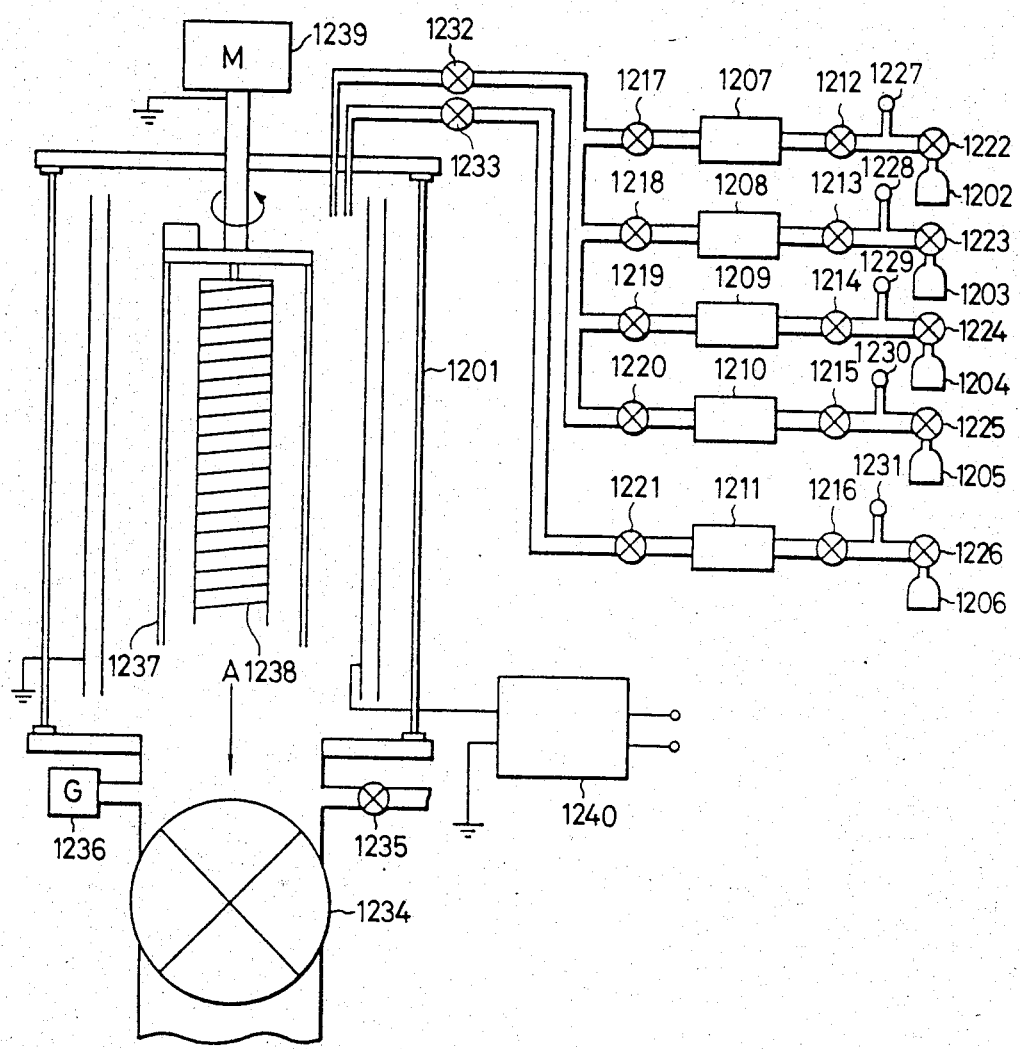
FIG. 12 is a schematic illustration of the device used for preparation of the photoconductive members of the present invention in Examples.

FIG. 12 shows one example of a device for producing a photoconductive member.

In the gas bombs 1202 to 1206, there are hermetically contained starting gases for formation of the photosensitive member of the present invention. For example, 1202 is a bomb containing SiH$_4$ gas diluted with He (purity: 99.999%, hereinafter abbreviated as SiH$_4$/He), 1203 is a bomb containing GeH$_4$ gas diluted with He (purity: 99.999%, hereinafter abbreviated as GeH$_4$/He), 1204 is a bomb containing SiF$_4$ gas diluted with He (purity: 99.999%, hereinafter abbreviated as SiF$_4$/He), 1205 is a bomb containing NH$_3$ gas (purity: 99.999%) and 1206 is a bomb containing H$_2$ gas (purity: 99.999%).

For allowing these gases to flow into the reaction chamber 1201, on confirmation of the valves 1222–1226 of the gas bombs 1202–1206 and the leak valve 1235 to be closed, and the inflow valves 1212–1216, the outflow valves 1217–1221 and the auxiliary valves 1232, 1233 to be opened, the main valve 1234 is first opened to evacuate the reaction chamber 1201 and the gas pipelines. As the next step, when the reading on the vacuum indicator 1236 becomes $5 \times 10^{-6}$ Torr, the auxiliary valves 1232, 1233 and the outflow valves 1217–1221 are closed.

Referring now to an example of forming the first layer (I) on the cylindrical substrate 1237, SiH$_4$/He gas from the gas bomb 1202, GeH$_4$/He gas from the gas bomb 1203 and NH$_3$ gas from the gas bomb 1205 are permitted to flow into the mass-flow controllers 1207, 1208, 1209 respectively, by opening the valves 1222, 1223, 1224 and controlling the pressures at the outlet pressure gauges 1227, 1228, 1229 to 1 Kg/cm$^2$ and opening gradually the inflow valves 1212, 1213, 1214 respectively. Subsequently, the outflow valves 1217, 1218, 1219 and the auxiliary valve 1232 are gradually opened to permit respective gases to flow into the reaction chamber 1201. The outflow valves 1217, 1218, 1219 are controlled so that the flow rate ratio of SiH$_4$/He, GeH$_4$/He and NH$_3$ gases may have a desired value and opening of the main valve 1234 is also controlled while watching the reading on the vacuum indicator 1236 so that the pressure in the reaction chamber 1201 may reach a desired value. And, after confirming that the temperature of the substrate 1237 is set at 50°–400° C. by the heater 1238, the power source 1240 is set at a desired power to excite glow discharge in the reaction chamber 1201, thereby forming a first layer region (G) on the substrate 1237. When the first layer region (G) is formed to a desired thickness, following the same conditions and the procedure except for completely closing the outflow valve 1218 and changing the discharging conditions, if desired, glow discharging is maintained for a desired period of time, whereby the second layer region (S) containing substantially no germanium atom can be formed on the first layer region (G).

For incorporation of a substance (C) for controlling conductivity in the first layer region (G) and/or the second layer region (S), for example, a gas such as B$_2$H$_6$, PH$_3$, etc. may be added to the gases to be introduced into the deposition chamber 1201 during formation of the first layer region (G) and/or the second layer region (S).

During layer formation, for uniformization of layer formation, the substrate 1237 should desirably be rotated by a motor 1239 at a constant speed.

For incorporation of halogen atoms in the first layer (I), for example, SiF$_4$ gas may further be added to the above gases in exciting glow discharging.

Also, when halogen atoms are contained in the first layer (I) without incorporation of hydrogen atoms, SiF$_4$/He gas and GeF$_4$/He gas may be employed in place of the previous SiH$_4$/He gas and GeH$_4$/He gas.

As described above, the photoconductive member having the layer structure as shown in FIG. 1 can be formed. For preparation of the photoconductive member with the layer structure shown in FIG. 11, the following procedure may be followed.

That is, formation of a second layer (II) on the first layer (I) formed to a desired thickness as described above may be performed by use of, for example, SiH$_4$ gas and respective gases of C$_2$H$_4$, or/and NO gases, optionally diluted with a diluting gas such as He, according to same valve operation as in formation of the first layer (I), and exciting glow discharge following the desirable conditions.

For incorporation of halogen atoms in the second layer (II), for example, SiF$_4$ gas and C$_2$H$_4$ or/and NO gases, or a gas mixture further added with SiH$_4$ gas, may be used to form the second layer (II) according to the same procedure as described above.

During formation of the respective layers, outflow valves other than those for necessary gases should of course be closed. Also, during formation of respective layers, in order to avoid remaining of the gas employed for formation of the preceding layer in the reaction chamber 1201 and the gas pipelines from the outflow valves 1217-1221 to the reaction chamber, the operation of evacuating the system to high vacuum by closing the outflow valves 1217-1221, opening the auxiliary valves 1232, 1233 and opening fully the main valve 1234 is conducted if necessary.

Each amount of carbon atoms and/or oxygen atoms contained in the second layer (II) can be controlled as desired by, for example, in the case of glow discharge, changing the flow rate ratio of SiH$_4$ gas and the gas such as C$_2$H$_4$ and/or NO to be introduced into the reaction chamber 1201 as desired, or in the case of layer formation by sputtering, changing the sputtering area ratio of silicon wafer to graphite wafer and/or SiO$_2$ wafer or molding a target with the use of a mixture of silicon powder with graphite powder and/or SiO$_2$ powder at a desired mixing ratio. The content of halogen atoms (X) contained in the second layer (II) can be controlled by controlling the flow rate of the starting gas for introduction of halogen atoms such as SiF$_4$ gas when introduced into the reaction chamber 1201.

In formation of the above first layer (I), at the stage when a desired amount of time has been elapsed after initiation of forming said layer, flowing of B$_2$H$_6$/He gas or NH$_3$ gas into the deposition chamber can be discontinued thereby controlling freely the respective layer thicknesses of the layer region (B) containing boron atoms and the layer region (N) containing nitrogen atoms.

Also, by controlling the gas flow rate of NH$_3$ gas into the deposition chamber 1201 according to a desired change rate curve, the depth profile of nitrogen atoms contained in the layer region (N) can be controlled as desired.

The present invention is further described by referring to the following Examples.

EXAMPLE 1

By means of the device shown in FIG. 12, an image forming member for electrophotography was prepared on a cylindrical aluminum substrate under the conditions shown in Table 1A.

The image forming member thus obtained was set in a charging-exposure testing device and subjected to corona charging at $\ominus$ 5.0 KV for 0.3 sec., followed immediately by irradiation of a light image. The light image was irradiated by means of a tungsten lamp light source at a dose of 2 lux.sec through a transmission type test chart.

Immediately thereafter, $\oplus$ chargeable developer (containing toner and carrier) was cascaded on the surface of the image forming member to give a good toner image on the surface of the image forming member. When the toner image was transferrd onto a transfer paper by corona charging of $\ominus$ 5.0 KV, a clear image of high density with excellent resolution and good gradation reproducibility was obtained.

EXAMPLE 2

By means of the device shown in FIG. 12, an image forming member for electrophotography was prepared by conducting layer formation in the same manner as in Example 1, except for changing the conditions to those shown in Table 2A.

For the image forming member thus obtained, an image was formed on a transfer paper according to the same conditions and procedure as in Example 1 except for reversing the charging polarity and the charge polarity of the developer, respectively. As the result, very clear image quality was obtained.

EXAMPLE 3

By means of the device shown in FIG. 12, an image forming member for electrophotography was prepared by conducting layer formation in the same manner as in Example 1, except for changing the conditions to those shown in Table 3A.

For the image forming member thus obtained, an image was formed on a transfer paper according to the same conditions and procedure as in Example 1. As the result, very clear image quality was obtained.

EXAMPLE 4

Example 1 was repeated except that the content of germanium atoms contained in the first layer was varied as shown in Table 4A by varying the gas flow rate of GeH$_4$/He gas to SiH$_4$/He gas to obtain respective image forming members for electrophotography.

For each of the image forming member thus obtained, images were formed on a transfer paper according to the same conditions and procedure as in Example 1 to obtain the results as shown in Table 4A.

EXAMPLE 5

Example 1 was repeated except that the layer thickness of the first layer was varied as shown in Table 5A to obtain respective image forming members for electrophotography.

For each of the image forming members thus obtained, images were formed on a transfer paper according to the same conditions and procedure as in Example 1 to obtain the results as shown in Table 5A.

EXAMPLE 6

By means of the device shown in FIG. 12, an image forming member for electrophotography was prepared on a cylindrical aluminum substrate under the conditions shown in Table 6A.

The image forming member thus obtained was set in a charging-exposure testing device and subjected to corona charging at ⊖5.0 KV for 0.3 sec., followed immediately by irradiation of a light image. The light image was irradiated by means of a tungsten lamp light source at a dose of 2 lux.sec through a transmission type test chart.

Immediately thereafter, ⊕ chargeable developer (containing toner and carrier) was cascaded on the surface of the image forming member to give a good toner image on the surface of the image forming member. When the toner image was transferred onto a transfer paper by corona charging of ⊖5.0 KV, a clear image of high density with excellent resolution and good gradation reproducibility was obtained.

EXAMPLE 7

For the image forming member for electrophotogarapy prepared under the same toner image forming conditions as in Example 1 except for using GaAs type semiconductor laser (10 mW) of 810 nm in place of the tungsten lamp as the light source, image quality evaluation was performed. As the result, an image of high quality, excellent in resolution and good in gradation reproducibility, could be obtained.

EXAMPLE 8

By means of the device shown in FIG. 12, an image forming member for electrophotography was prepared on a cylindrical aluminum substrate under the conditions shown in Table 1B.

The image forming member thus obtained was set in a charging-exposure testing device and subjected to corona charging at ⊕5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the image forming member to give a good toner image on the surface of the image forming member. When the toner image was transferred onto a transfer paper by corona charging of ⊕5.0 KV, a clear image of high density with excellent resolution and good gradation reproducibility was obtained.

EXAMPLE 9

By means of the device shown in FIG. 12, an image forming member for electrophotography was prepared by conducting layer formation in the same manner as in Example 8, except for changing the conditions to those shown in Table 2B.

For the image forming member thus obtained, an image was formed on a transfer paper according to the same conditions and procedure as in Example 8 except for reversing the charging polarity and the charge polarity of the developer, respectively. As the result, very clear image quality was obtained.

EXAMPLE 10

By means of the device shown in FIG. 12, an image forming member for electrophotography was prepared by conducting layer formation in the same manner as in Example 8, except for changing the conditions to those shown in Table 3B.

For the image forming member thus obtained, an image was formed on a transfer paper according to the same conditions and procedure as in Example 8. As the result, very clear image quality was obtained.

EXAMPLE 11

Example 8 was repeated except that the content of germanium atoms contained in the first layer was varied as shown in Table 4B by varying the gas flow rate ratio of GeH$_4$/He gas to SiH$_4$/He gas to obtain respective image forming members for electrophotography.

For each of the image forming members thus obtained, images were formed on a transfer paper according to the same conditions and procedure as in Example 8 to obtain the results as shown in Table 4B.

EXAMPLE 12

Example 8 was repeated except that the layer thickness of the first layer was varied as shown in Table 5B to obtain respective image forming members for electrophotography.

For each of the image forming members thus obtained, images were formed on a transfer paper according to the same conditions and procedure as in Example 8 to obtain the results as shown in Table 5B.

EXAMPLE 13

By means of the device shown in FIG. 12, image forming members for electrophotography were prepared on a cylindrical aluminum substrate under the conditions shown in Tables 6B to 8B, respectively (Sample Nos. 601B, 602B and 603B).

Each of the image forming members thus obtained was set in a charging-exposure testing device and subjected to corona charging at ⊖5.0 KV for 0.3 sec., followed immediately by irradiation of a light image. The light image was irradiated by means of a tungsten lamp light source at a dose of 2 lux.sec through a transmission type test chart.

Immediately thereafter, ⊕ chargeable developer (containing toner and carrier) was cascaded on the surface of the image forming member to give a good toner image on the surface of the image forming member. When the toner image was transferred onto a transfer paper by corona charging of ⊖5.0 KV, a clear image of high density with excellent resolution and good gradation reproducibility was obtained.

EXAMPLE 14

By means of the device shown in FIG. 12, image forming members for elecctrophotography were prepared on a cylindrical aluminum substrate in the same manner as in Example 8 except for employing the conditions shown in Tables 9B and 10B, respectively (Sample Nos. 701B and 702B).

For each of the image forming members thus obtained, images were formed on a transfer paper according to the same conditions and procedure as in Example 8. As the result, very clear image quality was obtained.

EXAMPLE 15

By means of the device shown in FIG. 12, image forming members for electrophotography were prepared on a cylindrical aluminum substrate in the same manner as in Example 8 except for employing the conditions shown in tables 11B to 15B, respectively (Sample Nos. 801B to 805B).

For each of the image forming members thus obtained, images were formed on a transfer paper according to the same conditions and procedure as in Example 8. As the result, very clear image quality was obtained.

EXAMPLE 16

For the image forming member for electrophotography prepared under the same toner image forming conditions as in Example 8 except for using GaAs type semiconductor laser (10 mW) of 810 nm inplace of the tungsten lamp as in the light source, image quality evaluation was performed. As the result, an image of high quality, excellent in resolution and good in gradation reproducibility, could be obtained.

EXAMPLE 17

By means of the device shown in FIG. 12, an image forming member for electrophotography was prepared on a cylindrical aluminum substrate under the conditions shown in Table 1C.

The image forming member thus obtained was set in a charging-exposure testing device and subjected to corona charging at $\ominus 5.0$ KV for 0.3 sec., followed immediately by irradiation of a light image. The light image was irradiated by means of a tungsten lamp light source at a dose of 2 lux.sec through a transmission type test chart.

Immediately thereafter, $\oplus$ chargeable developer (containing toner and carrier) was cascaded on the surface of the image forming member to give a good toner image on the surface of the image forming member. When the toner image was transferred onto a transfer paper by corona charging of $\ominus 5.0$ KV, a clear image of high density with excellent resolution and good gradation reproducibility was obtained.

EXAMPLE 18

By means of the device shown in FIG. 12, an image forming member for electrophotography was prepared by conducting layer formation in the same manner as in Example 17, except for changing the conditions to those shown in Table 2C.

For image forming member thus obtained, an image was formed on a transfer paper according to the same conditions and procedure as in Example 17 except for reversing the charging polarity and the charge polarity of the developer, respectively. As the result, very clear image quality was obtained.

EXAMPLE 19

By means of the device shown in FIG. 12, an image forming member for electrophotography was prepared by conducting layer formation in the same manner as in Example 17, except for changing the conditions to those shown in Table 3C.

For the image forming member thus obtained, an image was formed on a transfer paper according to the same conditions and procedure as in Example 17. As the result, very clear image quality was obtained.

EXAMPLE 20

Example 17 was repeated except that the content of germanium atoms contained in the first layer was varied as shown in Table 4C by varying the gas flow rate ratio of GeH$_4$/He gas to SiH$_4$/He gas to obtain respective image forming members for electrophotography.

For each of the image forming members thus obtained, images were formed on a transfer paper according to the same conditions and procedure as in Example 17 to obtain the results as shown in Table 4C.

EXAMPLE 21

Example 17 was repeated except that the layer thickness of the first layer was varied as shown in Table 5C to obtain respective image forming members for electrophotography.

For each of the image forming members thus obtained, images were formed on a transfer paper according to the same conditions and procedure as in Example 17 to obtain the results as shown in Table 5C.

EXAMPLE 22

By means of the device shown in FIG. 12, image forming members for electrophotography were prepared on a cylindrical aluminum substrate under the conditions shown in Table 6C.

Each of the image forming members thus obtained was set in a charging-exposure testing device and subjected to corona charging at $\ominus 5.0$ KV for 0.3 sec., followed immediately by irradiation of a light image. The light image was irradiated by means of a tungsten lamp light source at a does of 2 lux.sec through a transmission type test chart.

Immediately thereafter, $\oplus$ chargeable developer (containing toner and carreir) was cascaded on the surface of the image forming member to give a good toner image on the surface of the image forming member. When the toner image was transferred onto a transfer paper by corona charging of $\ominus 5.0$ KV, a clear image of high density with excellent resolution and good gradation reproducibility was obtained.

EXAMPLE 23

For the image forming member for electrophotography prepared under the same toner image forming conditions as in Example 17 except for using GaAs type semiconductor laser (10 mW) of 810 nm in place of the tungsten lamp as the light source, image quality evaluation was performed. As the result, an image of high quality, excellent in resolution and good in gradation reproducibility, could be obtained.

EXAMPLE 24

Following the same conditions and the procedure as in respective Examples 17 and 22, except for changing the conditions for preparation of the second layer (II) to the respective conditions as shown in Table 7C, image forming members for electrophotography were prepared, respectively (48 Samples of Sample No. 12-101C to 12-108C, 12-601C to 12-608C).

The respective image forming members for electrophotography thus prepared were individually set on a copying device, and according to the same conditions as described in respective Examples, each image forming member for electrophotography was evaluated for overall image quality of the transferred image and its durability when used continuously and repeatedly.

The results of the overall image quality evaluation and evaluation of durability by repeated continuous are for respective samples are shown in Table 8C.

EXAMPLE 25

Various image forming members were prepared according to the same method as in Example 17, except for varying the content ratio of silicon atoms to carbon atoms in the second layer (II) by varying the target area ratio of silicon wafer to graphite during formation of the second layer (II). For each of the image forming members thus obtained, the steps of image formation, developing and cleaning as described in Example 17 were repeated for about 50,000 times, and thereafter image evaluations were conducted to obtain the results as shown in Table 9C.

EXAMPLE 26

Various image forming members were prepared according to the same method as in Example 17, respectively, except for varying the content ratio of silicon atoms to carbon atoms in the second layer (II) by varying the flow rate ratio of SiH$_4$ gas to C$_2$H$_4$ gas during formation of the second layer (II).

For each of the image forming members thus obtained, the steps up to transfer were repeated for about 50,000 times according to the methods as described in Example 17, and thereafter image evaluations were conducted to obtain the results as shown in Table 10C.

EXAMPLE 27

Various image forming members were prepared according to the same method as in Example 17, respectively, except for varying the content ratio of silicon atoms to carbon atoms in the second layer (II) by varying the flow rate ratio of SiH$_4$ gas, SiF$_4$ gas and C$_2$H$_4$ gas during formation of the second layer (II). For each of the image forming members thus obtained, the steps of image formation, developing and cleaning as described in Example 17 were repeated for about 50,000 times, and thereafter image evaluations were conducted to obtain the results as shown in Table 11C.

EXAMPLE 28

Respective image forming members were prepared in the same manner as in Example 17, except for changing the layer thickness of the second layer (II), and the steps of image formation, developing and cleaning as described in Example 17 were repeated to obtain the results as shown in Table 12C.

EXAMPLE 29

By means of the device shown in FIG. 12, an image forming member for electrophotography was prepared on a cylindrical aluminum substrate under the conditions shown in Table 1D.

The image forming member thus obtained was set in a charging-exposure testing device and subjected to corona charging at ⊕5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the image forming member to give a good toner image on the surface of the image forming member. When the toner image was transferred onto a transfer paper by corona charging of ⊕5.0 KV, a clear image of high density with excellent resolution and good gradation reproducibility was obtained.

EXAMPLE 30

By means of the device shown in FIG. 12, an image forming member for electrophotography was prepared by conducting layer formation in the same manner as in Example 29, except for changing the conditions to those shown in Table 2D.

For the image forming member thus obtained, an image was formed on a transfer paper according to the same conditions and procedure as in Example 29 except for reversing the charging polarity and the charge polarity of the developer, respectively. As the result, very clear image quality was obtained.

EXAMPLE 31

By means of the device shown in FIG. 12, an image forming member for electrophotography was prepared by conducting layer formation in the same manner as in Example 29, except for changing the conditions to those shown in Table 3D.

For the image forming member thus obtained, an image was formed on a transfer paper according to the same conditions and procedure as in Example 29. As the result, very clear image quality was obtained.

EXAMPLE 32

Example 29 was repeated except that the content of germanium atoms contained in the first layer was varied as shown in Table 40 by varying the gas flow rate ratio of GeH$_4$/He gas to SiH$_4$/He gas to obtain respective image forming members for electropho- tography.

For each of the image forming members thus obtained, images were formed on a transfer paper according to the same conditions and procedure as in Example 29 to obtain the results as shown in Table 4D.

EXAMPLE 33

Example 29 was repeated except that the layer thickness of the first layer was varied as shown in Table 5D to obtain respective image forming members for electrophotography.

For each of the image forming members thus obtained, images were formed on a transfer paper according to the same conditions and procedure as in Example 29 to obtain the results as shown in Table 5D.

EXAMPLE 34

By means of the device shown in FIG. 12, image forming members for electrophotography were prepared on a cylindrical aluminum substrate under the conditions shown in Tables 6D to 8D, respectively (Sample Nos. 601D, 602D and 603D).

Each of the image forming members thus obtained was set in a charging-exposure testing device and subjected to corona charging at ⊖5.0 KV for 0.3 sec., followed immediately by irradiation of a light image. The light image was irradiated by means of a tungsten lamp light source at a dose of 2 lux.sec through a transmission type test chart.

Immediately thereafter, ⊕ chargeable developer (containing toner and carrier) was cascaded on the surface of the image forming member to give a good toner image on the surface of the image forming member. When the toner image was transferred onto a transfer paper by corona charging of ⊖5.0 KV, a clear image of high density with excellent resolution and good gradation reproducibility was obtained.

EXAMPLE 35

By means of the device shown in FIG. 12, image forming members for electrophotography were prepared on a cylindrical aluminum substrate in the same manner as in Example 29 except for employing the conditions shown in Tables 9D and 10D, respectively (Sample Nos. 701D and 702D).

For each of the image forming members thus obtained, images were formed on a transfer paper according to the same conditions and procedure as in Example 29. As the result, very clear image quality was obtained.

EXAMPLE 36

By means of the device shown in FIG. 12, image forming members for electrophotography were prepared on a cylindrical aluminum substrate in the same manner as in Example 29 except for employing the conditions shown in Tables 11D to 15D, respectively (Sample Nos 801D to 805D).

For each of the image forming members thus obtained, images were formed according to the same conditions and procedure as in Example 29. As the result, very clear image quality was obtained.

EXAMPLE 37

For the image forming member for electrophotography prepared under the same toner image forming conditions as in Example 29 except for using GaAs type semiconductor laser (10 mW) of 810 nm in place of the tungsten lamp as the light source, image quality evaluation was performed. As the result, an image of high quality, excellent in resolution and good in gradation reproducibility, could be obtained.

EXAMPLE 38

Following the same conditions and the procedure as in respective Table 1D in Example 29 and Table 6D in Example 34, except for changing the conditions for preparation of the second layer (II) to the respective conditions as shown in Table 16D, image forming members for electrophotography were prepared, respectively (72 Samples of Sample No. 12-401D to 12-408D, 12-701D to 12-708D, 12-801D to 12-808D).

The respective image forming members for electrophotography thus prepared were individually set on a copying device, and according to the same conditions as described in respective Examples, each image forming member for electrophotography was evaluated for overall image quality of the transferred image and its durability when used continuously and repeatedly.

The results of the overall image quality evaluation and evaluation of durability by repeated continuous use for respective samples are shown in Table 17D.

EXAMPLE 39

Various image forming members were prepared according to the same method as in Example 29, except for varying the content ratio of silicon atoms to carbon atoms in the second layer (II) by varying the target area ratio of silicon wafer to graphite during formation of the second layer (II). For each of the image forming members thus obtained, the steps of image formation, developing and cleaning as described in Example 29 were repeated for about 50,000 times, and thereafter image evaluations were conducted to obtain the results as shown in Table 18D.

EXAMPLE 40

Various image forming members were prepared according to the same method as in Example 29, respectively, except for varying the content ratio of silicon atoms to carbon atoms in the second layer (II) by varying the flow rate ratio of $SiH_4$ gas to $C_2H_4$ gas during formation of the second layer (II).

For each of the image forming members thus obtained, the steps up to transfer were repeated for about 50,000 times according to the methods as described in Example 29, and thereafter image evaluations were conducted to obtain the results as shown in Table 19D.

EXAMPLE 41

Various image forming members were prepared according to the same method as in Example 29, respectively, except for varying the content ratio of silicon atoms to carbon atoms in the second layer (II) by varying the flow rate ratio of $SiH_4$ gas, $SiF_4$ gas and $C_2H_4$ gas during formation of the second layer (II). For each of the image forming members thus obtained, the steps of image formation, developing and cleaning as described in Example 29 were repeated for about 50,000 times, and thereafter image evaluations were conducted to obtain the results as shown in Table 20D.

EXAMPLE 42

Respective image forming members were prepared in the same manner as in Example 29, except for changing the layer thickness of the second layer (II), and the steps of image formation, developing and cleaning as described in Example 29 were repeated to obtain the results as shown in Table 21D.

EXAMPLE 43

By means of the device shown in FIG. 12, an image forming member for electrophotography was prepared on a cylindrical aluminum substrate under the conditions shown in Table 1E.

The image forming member thus obtained was set in a charging-exposure testing device and subjected to corona charging at $\ominus 5.0$ KV for 0.3 sec., followed immediately by irradiation of a light image. The light image was irradiated by means of a tungsten lamp light source at a dose of 2 lux.sec through a transmission type test chart.

Immediately thereafter, $\oplus$ chargeable developer (containing toner and carrier) was cascaded on the surface of the image forming member to give a good toner image on the surface of the image forming member. When the toner image was transferred onto a transfer paper by corona charging of $\ominus 5.0$ KV, a clear image of high density with excellent resolution and good gradation reproducibility was obtained.

EXAMPLE 44

By means of the device shown in FIG. 12, an image forming member for electrophotography was prepared by conducting layer formation in the same manner as in Example 43, except for changing the conditions to those shown in Table 2E.

For the image forming member thus obtained, an image was formed on a transfer paper according to the same conditions and procedure as in Example 43 except for reversing the charging polarity and the charge polarity of the developer, respectively. As the result, very clear image quality was obtained.

EXAMPLE 45

By means of the device shown in FIG. 12, an image forming member for electrophotography was prepared by conducting layer formation in the same manner as in Example 43, except for changing the conditions to those shown in Table 3E.

For the image forming member thus obtained, an image was formed on a transfer paper according to the same conditions and procedure as in Example 43. As the result, very clear image quality was obtained.

EXAMPLE 46

Example 43 was repeated except that the content of germanium atoms contained in the first layer was varied as shown in Table 4E by varying the gas flow rate ratio of $GeH_4$/He gas to $SiH_4$/He gas to obtain respective image forming members for electrophotography.

For each of the image forming members thus obtained, images were formed on a transfer paper according to the same conditions and procedure as in Example 43 to obtain the results as shown in Table 4E.

EXAMPLE 47

Example 43 was repeated except that the layer thickness of the first layer was varied as shown in Table 5E to obtain respective image forming members for electrophotography.

For each of the image forming members thus obtained, images were formed on a transfer paper according to the same conditions and procedure as in Example 43 to obtain the results as shown in Table 5E.

EXAMPLE 48

By means of the device shown in FIG. 12, image forming members for electrophotography were prepared on a cylindrical aluminum substrate under the conditions shown in Table 6E.

Each of the image forming members thus obtained was set in a charging-exposure testing device and subjected to corona charging at ⊖5.0 KV for 0.3 sec., followed immediately by irradiation of a light image. The light image was irradiated by means of a tungsten lamp light source at a dose of 2 lux.sec through a transmission type test chart.

Immediately thereafter, ⊕ chargeable developer (containing toner and carrier) was cascaded on the surface of the image forming member to give a good toner image on the surface of the image forming member. When the toner image was transferred onto a transfer paper by corona charging of ⊖5.0 KV, a clear image of high density with excellent resolution and good gradation reproducibility was obtained.

EXAMPLE 49

For the image forming member for electrophotography prepared under the same toner image forming conditions as in Example 43 except for using GaAs type semiconductor laser (10 mW) of 810 nm in place of the tungsten lamp as the light source, image quality evaluation was performed. As the result, an image of high quality, excellent in resolution and good in gradation reproducibility, could be obtained.

EXAMPLE 50

Following the same conditions and the procedure as in respective Examples 44, 45 and 47, except for changing the conditions for preparation of the second layer (II) to the respective conditions as shown in Table 7E, image forming members for electrophotography were prepared, respectively (24 Samples of Sample No. 11-401E to 11-408E, 11-501E to 11-508E, 11-601E to 11-608E).

The respective image forming members for electrophotography thus prepared were individually set on a copying device, and according to the same conditions as described in respective Examples, each image forming member for electrophotography was evaluated for overall image quality of the transferred image and its durability when used continuously and repeatedly.

The results of the overall image quality evaluation and evaluation of durability by repeated continuous use for respective samples are shown in Table 8E.

EXAMPLE 51

Various image forming members were prepared according to the same method as in Example 43, except for varying the content ratio of silicon atoms to oxygen atoms in the second layer (II) by varying the target area ratio of silicon wafer to $SiO_2$ during formation of the second layer (II). For each of the image forming members thus obtained, the steps of images formation, developing and cleaning as described in Example 43 were repeated for about 50,000 times, and thereafter image evaluations were conducted to obtain the results as shown in Table 9E.

EXAMPLE 52

Various image forming members were prepared according to the same method as in Example 43, respectively, except for varying the content ratio of silicon atoms to oxygen atoms in the second layer (II) by varying the flow rate ratio of $SiH_4$ gas to NO gas during formation of the second layer (II).

For each of the image forming members thus obtained, the steps up to transfer were repeated for about 50,000 times according to the methods as described in Example 43, and thereafter image evaluations were conducted to obtain the results as shown in Table 10E.

EXAMPLE 53

Various image forming members were prepared according to the same method as in Example 43, respectively, except for varying the content ratio of silicon atoms to carbon atoms in the second layer (II) by varying the flow rate ratio of $SiH_4$ gas, $SiF_4$ gas and NO gas during formation of the second layer (II). For each of the image forming members thus obtained, the steps of image formation, developing and cleaning as described in Example 43 were repeated for about 50,000 times, and thereafter image evaluations were conducted to obtain the results as shown in Table 11E.

EXAMPLE 54

Respective image forming members were prepared in the same manner as in Example 43, except for changing the layer thickness of the second layer (II), and the steps of image formation, developing and cleaning as described in Example 43 were repeated to obtain the results as shown in Table 12E.

EXAMPLE 55

By means of the device shown in FIG. 12, an image forming member for electrophotography was prepared on a cylindrical aluminum substrate under the conditions shown in Table 1F.

The image forming member thus obtained was set in a charging-exposure testing device and subjected to corona charging at ⊕5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the image forming member to give a good toner image on the surface of the image forming member. When the toner image was transferred onto a transfer paper by corona charging of ⊕5.0 KV, a clear image of high density with excellent resolution and good gradation reproducibility was obtained.

EXAMPLE 56

By means of the device shown in FIG. 12, an image forming member for electrophotography was prepared by conducting layer formation in the same manner as in Example 55, except for changing the conditions to those shown in Table 2F.

For the image forming member thus obtained, an image was formed on a transfer paper according to the same conditions and procedure as in Example 55 except for reversing the charging polarity and the charge polarity of the developer, respectively. As the result, very clear image quality was obtained.

EXAMPLE 57

By means of the device shown in FIG. 12, an image forming member for electrophotography was prepared by conducting layer formtion in the same manner as in Example 55, except for changing the conditions to those shown in Table 3F.

For the image forming member thus obtained, an image was formed on a transfer paper according to the same conditions and procedure as in Example 55. As the result, very clear image quality was obtained.

EXAMPLE 58

Example 55 was repeated except that the content of germanium atoms contained in the first layer was varied as shown in Table 4F by varying the gas flow rate ratio of $GeH_4$/He gas to $SiH_4$/He gas to obtain respective image forming members for electrophotography.

For each of the image forming members thus obtained, images were formed on a transfer paper according to the same conditions and procedure as in Example 55 to obtain the results as shown in Table 4F.

EXAMPLE 59

Example 55 was repeated except that the layer thickness of the first layer was varied as shown in Table 5F to obtain respective image forming members for electrophotography.

For each of the image forming members thus obtained, images were formed on a transfer paper according to the same conditions and procedure as in Example 55 to obtain the results as shown in Table 5F.

EXAMPLE 60

By means of the device shown in FIG. 12, image forming members for electrophotography were prepared on a cylindrical aluminum substrate under the conditions shown in Tables 6F to 8F, respectively (Sample Nos. 601F, 602F and 603F).

Each of the image forming members thus obtained was set in a charging-exposure testing device and subjected to corona charging at ⊖5.0 KV for 0.3 sec., followed immediately by irradiation of a light image. The light image was irradiated by means of a tungsten lamp light source at a dose of 2 lux.sec through a transmission type test chart.

Immediately thereafter, ⊕ chargeable developer (containing toner and carrier) was cascaded on the surface of the image forming member to give a good toner image on the surface of the image forming member. When the toner image was transferred onto a transfer paper by corona charging of ⊖5.0 KV, a clear image of high density with excellent resolution and good gradation reproducibility was obtained.

EXAMPLE 61

By means of the device shown in FIG. 12, image forming members for electrophotography were prepared on a cylindrical aluminum substrate in the same manner as in Example 55 except for employing the conditions shown in Tables 9F and 10F, respectively (Sample Nos. 701F and 702F).

For each of the image forming members thus obtained, images were formed on a transfer paper according to the same conditions and procedure as in Example 55. As the result, very clear image quality was obtained.

EXAMPLE 62

By means of the device shown in FIG. 12, image forming members for electrophotography were prepared on a cylindrical aluminum substrate in the same manner as in Example 55 except for employing the conditions shown in Tables 11F to 15F, respectively (Sample Nos. 801F to 805F).

For each of the image forming members thus obtained, images were formed on a transfer paper according to the same conditions and procedure as in Example 55. As the result, very clear image quality was obtained.

EXAMPLE 63

For the image forming member for electrophotography prepared under the same toner image forming conditions as in Example 55 except for using GaAs type semiconductor laser (10 mW) of 810 nm in place of the tungsten lamp as the light source, image quality evaluation was performed. As the result, an image of high quality, excellent in resolution and good in gradation reproducibility, could be obtained.

EXAMPLE 64

Following the same conditions and the procedure as in respective Examples 55, 56 and 57, except for changing the conditions for preparation of the second layer (II) to the respective conditions as shown in Table 16F, image forming members for electrophotography were prepared, respectively (24 Samples of Sample No. 11-101F to 11-108F, 11-201F to 11-208F, 11-301F to 11-308F).

The respective image forming members for electrophotography thus prepared were individually set on a copying device, and according to the same conditions as described in respective Examples, each image forming member for electrophotography was evaluated for overall image quality of the transferred image and its durability when used continuously and repeatedly.

The results of the overall image quality evaluation and evaluation of durability by repeated continuous use for respective samples are shown in Table 17F.

EXAMPLE 65

Various image forming members were prepared according to the same method as in Example 55, except for varying the content ratio of silicon atoms to oxygen atoms in the second layer (II) by varying the target area ratio of silicon wafer to SiO₂ and also the mixing ratio of Ar to NO during formation of the second layer (II). For each of the image forming members thus obtained, the steps of image formation, developing and cleaning as described in Example 55 were repeated for about 50,000 times, and thereafter image evaluations were conducted to obtain the results as shown in Table 18F.

EXAMPLE 66

Various image forming members were prepared according to the same method as in Example 55, respectively, except for varying the content ratio of silicon atoms to oxygen atoms in the second layer (II) by varying the flow rate ratio of SiH₄ gas to NO gas during formation of the second layer (II).

For each of the image forming members thus obtained, the steps up to transfer were repeated for about 50,000 times according to the methods as described in Example 55, and thereafter image evaluations were conducted to obtain the results as shown in Table 19F.

EXAMPLE 67

Various image forming members were prepared according to the same method as in Example 55, respectively, except for varying the content ratio of silicon atoms to oxygen atoms in the second layer (II) by varying the flow rate ratio of SiH₄ gas, SiF₄ gas and NO gas during formation of the second layer (II). For each of the image forming members thus obtained, the steps of image formation, developing and cleaning as described in Example 55 were repeated for about 50,000 times, and thereafter image evaluations were conducted to obtain the results as shown in Table 20F.

EXAMPLE 68

Respective image forming members were prepared in the same manner as in Example 29, except for changing the layer thickness of the second layer (II), and the steps of image formation, developing and cleaning as described in Example 55 were repeated to obtain the results as shown in Table 21F.

The common layer forming conditions in the respective Examples of the present invention are shown below:

Substrate temperature:
  Germanium atom (Ge) containing layer ... 200° C.
  No germanium atom (Ge) containing layer ... about 250° C.
Discharging frequency: 13.56 MHz
Inner pressure in reaction chamber during the reaction: 0.3 Torr.

TABLE 1A

| Layer constitution | Gases employed | Flow rate (SCCM) | Flow rate ratio | Discharging power (W/cm²) | Layer formation rate (Å/sec) | Layer thickness(μ) |
|---|---|---|---|---|---|---|
| First layer | SiH₄/He = 0.05<br>GeH₄/He = 0.05<br>NH₃ | SiH₄ + GeH₄ = 50 | GeH₄/SiH₄ = 1/1<br>NH₃/(GeH₄ + SiH₄) = 2/100 | 0.18 | 5 | 3 |
| Second layer | SiH₄/He = 0.5 | SiH₄ = 200 | | 0.18 | 15 | 15 |

TABLE 2A

| Layer constitution | Gases employed | Flow rate (SCCM) | Flow rate ratio | Discharging power (W/cm²) | Layer formation rate (Å/sec) | Layer thickness(μ) |
|---|---|---|---|---|---|---|
| First layer | SiH₄/He = 0.05<br>GeH₄/He = 0.05<br>NH₃ | SiH₄ + GeH₄ = 50 | GeH₄/SiH₄ = 1/10<br>NH₃/(GeH₄ + SiH₄) = 3/100~0<br>(linearly reduced) | 0.18 | 5 | 5 |
| Second layer | SiH₄/He = 0.05<br>GeH₄/He = 0.05 | SiH₄ + GeH₄ = 50 | GeH₄/SiH₄ = 1/10 | 0.18 | 5 | 1 |
| Third layer | SiH₄/He = 0.5 | SiH₄ = 200 | | 0.18 | 15 | 15 |

TABLE 3A

| Layer constitution | Gases employed | Flow rate (SCCM) | Flow rate ratio | Discharging power (W/cm²) | Layer formation rate (Å/sec) | Layer thickness(μ) |
|---|---|---|---|---|---|---|
| First layer | SiH₄/He = 0.05<br>GeH₄/He = 0.05<br>NH₃ | SiH₄ + GeH₄ = 50 | GeH₄/SiH₄ = 4/10<br>NH₃/(GeH₄ + SiH₄) = 2/100 | 0.18 | 5 | 2 |
| Second layer | SiH₄/He = 0.5<br>NH₃<br>B₂H₆/He = 10⁻³ | SiH₄ = 200 | NH₃/SiH₄ = 2/100<br>B₂H₆/SiH₄ = 1 × 10⁻⁵ | 0.18 | 15 | 2 |
| Third layer | SiH₄/He = 0.5<br>B₂H₆/He = 10⁻³ | SiH₄ = 200 | B₂H₆/SiH₄ = 1 × 10⁻⁵ | 0.18 | 15 | 15 |

TABLE 4A

| Sample No. | 401A | 402A | 403A | 404A | 405A | 406A | 407A |
|---|---|---|---|---|---|---|---|
| Ge content (atomic %) | 1 | 3 | 5 | 10 | 40 | 60 | 90 |
| Evaluation | ▵ | ◯ | ⦿ | ⦿ | ⦿ | ◯ | ▵ |

⦿: Excellent
◯: Good
▵: Practically satisfactory

TABLE 5A

| Sample | 501A | 502A | 503A | 504A | 505A |
|---|---|---|---|---|---|
| Layer thickness(μ) | 0.1 | 0.5 | 1 | 2 | 5 |
| Evaluation | ◯ | ◯ | ⦿ | ⦿ | ◯ |

⦿: Excellent
◯: Good

TABLE 6A

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>NH$_3$ | SiH$_4$ + GeH$_4$ = 50 | GeH$_4$/SiH$_4$ = 4/10<br>NH$_3$/(GeH$_4$ + SiH$_4$) = 2/100 | 0.18 | 5 | 2 |
| Second layer | SiH$_4$/He = 0.5<br>PH$_3$/He = 10$^{-3}$ | SiH$_4$ = 200 | PH$_3$/SiH$_4$ = 1 × 10$^{-7}$ | 0.18 | 15 | 20 |

TABLE 1B

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 3/10<br>B$_2$H$_6$/(GeH$_4$ + SiH$_4$) = 3 × 10$^{-3}$<br>NH$_3$/(GeH$_4$ + SiH$_4$) = 3/100 | 0.18 | 5 | 1 |
| Second layer | SiH$_4$/He = 0.5 | SiH$_4$ = 200 | | 0.18 | 15 | 20 |

TABLE 2B

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10<br>B$_2$H$_6$/(GeH$_4$ + SiH$_4$) = 3 × 10$^{-3}$<br>NH$_3$/(GeH$_4$ + SiH$_4$) = 3/100 | 0.18 | 5 | 1 |
| Second layer | SiH$_4$/He = 0.05<br>GeH$_4$/He = 0.05 | SiH$_4$ + GeH$_4$ = 50 | GeH$_4$/SiH$_4$ = 1/10 | 0.18 | 15 | 19 |
| Third layer | SiH$_4$/He = 0.5 | SiH$_4$ = 200 | | 0.18 | 15 | 5 |

TABLE 3B

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 3/10<br>B$_2$H$_6$/(GeH$_4$ + SiH$_4$) = 5 × 10$^{-3}$<br>NH$_3$/(GeH$_4$ + SiH$_4$) = 1/100 | 0.18 | 5 | 2 |
| Second layer | SiH$_4$/He = 0.5<br>B$_2$H$_6$/He = 10$^{-3}$ | SiH$_4$ = 200 | B$_2$H$_6$/SiH$_4$ = 2 × 10$^{-4}$ | 0.18 | 15 | 20 |

TABLE 4B

| Sample No. | 401B | 402B | 403B | 404B | 405B | 406B | 407B | 408B |
|---|---|---|---|---|---|---|---|---|
| GeH$_4$/SiH$_4$ Flow rate ratio | 5/100 | 1/10 | 2/10 | 4/10 | 5/10 | 7/10 | 8/10 | 1/1 |
| Ge content (atomic %) | 4.3 | 8.4 | 15.4 | 26.7 | 32.3 | 38.9 | 42 | 47.6 |
| Evaluation | ◉ | ◉ | ◉ | ◉ | ◉ | ○ | ○ | ○ |

◉: Excellent
○: Good

TABLE 5B

| Sample No. | 501B | 502B | 503B | 504B | 505B | 506B | 507B | 508B |
|---|---|---|---|---|---|---|---|---|
| Layer thickness | 30Å | 500Å | 0.1$\mu$ | 0.3$\mu$ | 0.8$\mu$ | 3$\mu$ | 4$\mu$ | 5$\mu$ |
| Evaluation | △ | ○ | ◉ | ◉ | ◉ | ○ | ○ | △ |

◉: Excellent
○: Good
△: Practically satisfactory

TABLE 6B (Sample No. 601B)

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 5/10<br>B$_2$H$_6$/(GeH$_4$ + SiH$_4$) = 5 × 10$^{-3}$<br>NH$_3$/(GeH$_4$ + SiH$_4$) = 1/100 | 0.18 | 5 | 2 |
| Second layer | SiH$_4$/He = 0.5<br>PH$_3$/He = 10$^{-3}$ | SiH$_4$ = 200 | PH$_3$/SiH$_4$ = 9 × 10$^{-5}$ | 0.18 | 15 | 20 |

TABLE 7B

(Sample No. 602B)

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10<br>B$_2$H$_6$/(GeH$_4$ + SiH$_4$) = 8 × 10$^{-4}$<br>NH$_3$/(GeH$_4$ + SiH$_4$) = 1/100 | 0.18 | 5 | 15 |
| Second layer | SiH$_4$/He = 0.5<br>PH$_3$/He = 10$^{-3}$ | SiH$_4$ = 200 | PH$_3$/SiH$_4$ = 1 × 10$^{-5}$ | 0.18 | 15 | 5 |

TABLE 8B

(Sample No. 603B)

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 3/10<br>B$_2$H$_6$/(GeH$_4$ + SiH$_4$) = 3 × 10$^{-3}$<br>NH$_3$/(GeH$_4$ + SiH$_4$) = 3/100 | 0.18 | 5 | 1 |
| Second layer | SiH$_4$/He = 0.5<br>B$_2$H$_6$/He = 10$^{-3}$ | SiH$_4$ = 200 | B$_2$H$_6$/SiH$_4$ = 3 × 10$^{-4}$ | 0.18 | 15 | 20 |

TABLE 9B

(Sample No. 701B)

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10<br>B$_2$H$_6$/(GeH$_4$ + SiH$_4$) = 1 × 10$^{-5}$<br>NH$_3$/(GeH$_4$ + SiH$_4$) = 3/100 | 0.18 | 5 | 1 |
| Second layer | SiH$_4$/He = 0.05<br>GeH$_4$/He = 0.05<br>B$_2$H$_5$/He = 10$^{-3}$ | SiH$_4$ + GeH$_4$ = 50 | GeH$_4$/SiH$_4$ = 1/10<br>B$_2$H$_6$/(GeH$_4$ + SiH$_4$) = 1/10$^{-5}$ | 0.18 | 5 | 19 |
| Third layer | SiH$_4$/He = 0.5<br>B$_2$H$_6$/He = 10$^{-3}$ | SiH$_4$ = 200 | B$_2$H$_6$/SiH$_4$ = 3 × 10$^{-4}$ | 0.18 | 15 | 5 |

TABLE 10B

(Sample No. 702B)

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 3/10<br>B$_2$H$_6$/(GeH$_4$ + SiH$_4$) = 1 × 10$^{-5}$<br>NH$_3$/(SiH$_4$ + SiH$_4$) = 3/100 | 0.18 | 5 | 1 |
| Second layer | SiH$_4$/He = 0.05<br>GeH$_4$/He = 0.05<br>NH$_3$ | SiH$_4$ + GeH$_4$ = 50 | GeH$_4$/SiH$_4$ = 3/10<br>NH$_3$/SiH$_4$ = 3/100 | 0.18 | 5 | 1 |
| Third layer | SiH$_4$/He = 0.5<br>NH$_3$<br>B$_2$H$_6$/He = 10$^{-3}$ | SiH$_4$ = 200 | NH$_3$/SiH$_4$ = 3/100<br>B$_2$H$_6$/SiH$_4$ = 1 × 10$^{-4}$ | 0.18 | 15 | 1 |
| Fourth layer | SiH$_4$/He = 0.5<br>B$_2$H$_6$/He = 10$^{-3}$ | SiH$_4$ = 200 | B$_2$H$_6$/SiH$_4$ = 1 × 10$^{-4}$ | 0.18 | 15 | 15 |

TABLE 11B

(Sample No. 801B)

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 3/10<br>B$_2$H$_6$/(GeH$_4$ + SiH$_4$) = 3 × 10$^{-3}$<br>NH$_3$/(SiH$_4$ + SiH$_4$) = 3/100~2.83/100 | 0.18 | 5 | 1 |
| Second layer | SiH$_4$/He = 0.05<br>GeH$_4$/He = 0.05<br>NH$_3$ | SiH$_4$ + GeH$_4$ = 50 | GeH$_4$/SiH$_4$ = 3/10<br>NH$_3$/(GeH$_4$ + SiH$_4$) = 2.83/100~0 | 0.18 | 5 | 1 |

TABLE 11B-continued
(Sample No. 801B)

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| Third layer | SiH$_4$/He = 0.5 | SiH$_4$ = 200 | | 0.18 | 15 | 19 |

The flow rate ratio NH$_3$/(GeH$_4$ + SiH$_4$) was reduced linearly.

TABLE 12B
(Sample No. 802B)

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10<br>B$_2$H$_6$/(GeH$_4$ + SiH$_4$) = 3 × 10$^{-4}$<br>NH$_3$/(GeH$_4$ + SiH$_4$) = 3/100~0 | 0.18 | 5 | 0.5 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 1/10<br>B$_2$H$_6$/(GeH$_4$ + SiH$_4$) = 3 × 10$^{-3}$ | 0.18 | 5 | 0.5 |
| Third layer | SiH$_4$/He = 0.05<br>GeH$_4$/He = 0.05 | SiH$_4$ + GeH$_4$ = 50 | GeH$_4$/SiH$_4$ = 1/10 | 0.18 | 15 | 19 |
| Fourth layer | SiH$_4$/He = 0.5 | SiH$_4$ = 200 | | 0.18 | 15 | 15 |

TABLE 13B
(Sample No. 803B)

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 3/10<br>B$_2$H$_6$/(GeH$_4$ + SiH$_4$) = 5 × 10$^{-3}$<br>NH$_3$/(GeH$_4$ + SiH$_4$) = 1/100~0 | 0.18 | 5 | 1 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 3/10<br>B$_2$H$_6$/(GeH$_4$ + SiH$_4$) = 5/10$^{-3}$ | 0.18 | 5 | 1 |
| Third layer | SiH$_4$/He = 0.5<br>B$_2$H$_6$/He = 10$^{-3}$ | SiH$_4$ = 200 | B$_2$H$_6$/SiH$_4$ = 2 × 10$^{-4}$ | 0.18 | 15 | 20 |

TABLE 14B
(Sample No. 804B)

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 3/10<br>B$_2$H$_6$/SiH$_4$ = 3 × 10$^{-3}$<br>NH$_3$SiH$_4$ = 3/100~2.83/100 | 0.18 | 5 | 1 |
| Second layer | SiH$_4$/He = 0.5<br>NH$_3$<br>B$_2$H$_6$/He = 10$^{-3}$ | SiH$_4$ = 200 | NH$_3$/SiH$_4$ = 2.83/100~0<br>B$_2$H$_6$/SiH$_4$ = 3 × 10$^{-4}$ | 0.18 | 15 | 20 |

The flow rate ratio NH$_3$/SiH$_4$ was reduced linearly.

TABLE 15B
(Sample No. 805B)

| Layer constitution | Gases employed | Flow rate (SCCM) | Flow rate ratio | Discharging power (W/cm$^2$) | Layer formation rate (Å/sec) | Layer thickness($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10<br>B$_2$H$_6$/(GeH$_4$ + SiH$_4$) = 1 × 10$^{-5}$<br>NH$_3$/(GeH$_4$ + SiH$_4$) = 3/100~0 | 0.18 | 5 | 1 |
| Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 1/10<br>B$_2$H$_6$/(GeH$_4$ + SiH$_4$) = 1/10$^{-5}$ | 0.18 | 5 | 19 |
| Third layer | SiH$_4$/He = 0.5<br>B$_2$H$_6$/He = 10$^{-3}$ | SiH$_4$ = 200 | B$_2$H$_6$/SiH$_4$ = 3 × 10$^{-4}$ | 0.18 | 15 | 5 |

The flow rate ratio NH$_3$/(GeH$_4$ + SiH$_4$) was reduced linearly.

TABLE 1C

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 1/1<br>NH$_3$/(GeH$_4$ + SiH$_4$)2/100 | 0.18 | 5 | 3 |
| | Second layer | SiH$_4$/He = 0.5 | SiH$_4$ = 200 | | 0.18 | 15 | 15 |
| Layer (II) | | SiH$_4$/He = 0.5<br>C$_2$H$_4$ | SiH$_4$ = 100 | SiH$_4$/C$_2$H$_4$ = 3/7 | 0.18 | 10 | 0.5 |

TABLE 2C

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 1/10<br>NH$_3$/(GeH$_4$ + SiH$_4$) = 3/100~0<br>(linearly reduced) | 0.18 | 5 | 5 |
| | Second layer | SiH$_4$/He = 0.05<br>GeH$_4$/He = 0.05 | SiH$_4$ + GeH$_4$ = 50 | GeH$_4$/SiH$_4$ = 1/10 | 0.18 | 5 | 1 |
| | Third layer | SiH$_4$/He = 0.5 | SiH$_4$ = 200 | | 0.18 | 15 | 15 |

TABLE 3C

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 4/10<br>NH$_3$/(GeH$_4$ + SiH$_4$) = 2/100 | 0.18 | 5 | 2 |
| | Second layer | SiH$_4$/He = 0.5<br>NH$_3$<br>B$_2$H$_6$/He = 10$^{-3}$ | SiH$_4$ = 200 | NH$_3$/SiH$_4$ = 2/100<br>B$_2$H$_6$/SiH$_4$ = 1 × 10$^{-5}$ | 0.18 | 5 | 2 |
| | Third layer | SiH$_4$/He = 0.5<br>B$_2$H$_6$/He = 10$^{-3}$ | SiH$_4$ = 200 | B$_2$H$_6$/SiH$_4$ = 1 × 10$^{-5}$ | 0.18 | 15 | 15 |

TABLE 4C

| Sample No. | 401C | 402C | 403C | 404C | 405C | 406C | 407C |
|---|---|---|---|---|---|---|---|
| Ge content (atomic %) | 1 | 3 | 5 | 10 | 40 | 60 | 90 |
| Evaluation | Δ | ○ | ⊚ | ⊚ | ⊚ | ○ | Δ |

⊚: Excellent
○: Good

TABLE 5C

| Sample No. | 501C | 502C | 503C | 504C | 505C |
|---|---|---|---|---|---|
| Layer thickness($\mu$) | 0.1 | 0.5 | 1 | 2 | 5 |
| Evaluation | ○ | ○ | ⊚ | ⊚ | ○ |

⊚: Excellent
○: Good

TABLE 6C

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.005<br>GeH$_4$/He = 0.05<br>NH$_3$ | GeH$_4$ = 50 | SiH$_4$GeH$_4$ = 1/100<br>NH$_3$/(GeH$_4$ + SiH$_4$) = 2/100 | 0.18 | 5 | 2 |
| | Second layer | SiH$_4$/He = 0.5<br>PH$_3$/He = 10$^{-3}$ | SiH$_4$ = 200 | GeH$_4$/SiH$_4$ = 50<br>PH$_3$/SiH$_4$ = 1 × 10$^{-7}$ | 0.18 | 15 | 20 |
| Layer (III) | | SiH$_4$/He = 0.5<br>C$_2$H$_4$ | SiH$_4$ = 100 | SiH$_4$/C$_2$H$_4$ = 3/7 | 0.18 | 10 | 0.5 |

Δ: Practically satisfactory

TABLE 7C

| Condition | Gases employed | Flow rate (SCCM) | Flow rate ratio or Area ratio | Discharging power (W/cm$^2$) | Layer thickness($\mu$) |
|---|---|---|---|---|---|
| 12-1C | Ar | 200 | Si wafer:graphite = 1.5:8.5 | 0.3 | 0.5 |
| 12-2C | Ar | 200 | Si wafer:graphite = 0.5:9.5 | 0.3 | 0.3 |
| 12-3C | Ar | 200 | Si wafer:graphite = 6:4 | 0.3 | 1.0 |
| 12-4C | SiH$_4$/He = 1<br>C$_2$H$_4$ | SiH$_4$ = 15 | SiH$_4$:C$_2$H$_4$ = 0.4:9.6 | 0.18 | 0.3 |
| 12-5C | SiH$_4$/He = 0.5 | SiH$_4$ = 100 | SiH$_4$:C$_2$H$_4$ = | 0.18 | 1.5 |

TABLE 7C-continued

| Condition | Gases employed | Flow rate (SCCM) | Flow rate ratio or Area ratio | Discharging power (W/cm$^2$) | Layer thickness($\mu$) |
|---|---|---|---|---|---|
| 12-6C | C$_2$H$_4$<br>SiH$_4$/He = 0.5<br>SiF$_4$/He = 0.5<br>C$_2$H$_4$ | SiH$_4$ + SiF$_4$ = 150 | 5:5<br>SiH$_4$:SiF$_4$:C$_2$H$_4$ =<br>1.5:1.5:7 | 0.18 | 0.5 |
| 12-7C | SiH$_4$/He = 0.5<br>SiF$_4$/He = 0.5<br>C$_2$H$_4$ | SiH$_4$ + SiF$_4$ = 15 | SiH$_4$:SiF$_4$:C$_2$H$_4$ =<br>0.3:0.1:9.6 | 0.18 | 0.3 |
| 12-8C | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ =<br>3:3:4 | 0.18 | 1.5 |

TABLE 8C

| Preparation conditions for layer (II) | Sample No./Evaluation | | Sample No. | |
|---|---|---|---|---|
| | | | Overall image evaluation | Durability evaluation |
| 12-1C | 12-101C<br>○ ○ | 12-601C<br>○ ○ | Evaluation standard:<br>⊙: Excellent<br>○: Good | |
| 12-2C | 12-102C<br>○ ○ | 12-602C<br>○ ○ | | |
| 12-3C | 12-103C<br>○ ○ | 12-603C<br>○ ○ | | |
| 12-4C | 12-104C<br>⊙ ⊙ | 12-604C<br>⊙ ⊙ | | |
| 12-5C | 12-105C<br>⊙ ⊙ | 12-605C<br>⊙ ⊙ | | |
| 12-6C | 12-106C<br>⊙ ⊙ | 12-606C<br>⊙ ⊙ | | |
| 12-7C | 12-107C<br>○ ○ | 12-607C<br>○ ○ | | |
| 12-8C | 12-108C<br>○ ○ | 12-608C<br>○ ○ | | |

TABLE 9C

| Sample No. | 1301C | 1302C | 1303C | 1304C | 1305C | 1306C | 1307C |
|---|---|---|---|---|---|---|---|
| Si:C target (area ratio) | 9:1 | 6.5:3.5 | 4:6 | 2:8 | 1:9 | 0.5:9.5 | 0.2:9.8 |
| Si:C (content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊙ | ⊙ | ○ | Δ | x |

⊙: Very good
○: Good
Δ: Sufficiently practically usable
x: Image defect formed

TABLE 10C

| Sample No. | 1401C | 1402C | 1403C | 1404C | 1405C | 1406C | 1407C | 1408C |
|---|---|---|---|---|---|---|---|---|
| SiH$_4$:C$_2$H$_4$ (flow rate ratio) | 9:1 | 6:4 | 4:6 | 2:8 | 1:9 | 0.5:9.5 | 0.35:9.65 | 0.2:9.8 |
| Si:C (content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Sufficiently practically usable
x: Image defect formed

TABLE 11C

| Sample No. | 1501C | 1502C | 1503C | 1504C | 1505C | 1506C | 1507C | 1508C |
|---|---|---|---|---|---|---|---|---|
| SiH$_4$:SiF$_4$:C$_2$H$_4$ (flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Practically satisfactory
x: Image defect formed

TABLE 12C

| Sample No. | Thickness of layer (II) ($\mu$) | Results |
|---|---|---|
| 1601C | 0.001 | Image defect liable to occur |
| 1602C | 0.02 | No image defect during 20,000 repetitions |
| 1603C | 0.05 | Stable for 50,000 repetitions |
| 1604C | 1 | Stable for 200,000 repetitions |

TABLE 1D

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 3/10<br>B$_2$H$_6$/(GeH$_4$ + SiH$_4$) = 3 × 10$^{-3}$<br>NH$_3$/(GeH$_4$ + SiH$_4$) = 3/100 | 0.18 | 5 | 1 |
| | Second layer | SiH$_4$/He = 0.5 | SiH$_4$ = 200 | | 0.18 | 15 | 20 |
| Layer (II) | | SiH$_4$/He = 0.5<br>C$_2$H$_4$ | SiH$_4$ = 100 | SiH$_4$/C$_2$H$_4$ = 3/7 | 0.18 | 10 | 0.5 |

TABLE 2D

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10<br>B$_2$H$_6$/(GeH$_4$ + SiH$_4$) = 3/10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$ + SiH$_4$ = 1/10 | 0.18 | 5 | 19 |
| | Third layer | SiH$_4$/He = 0.5 | SiH$_4$ = 200 | | 0.18 | 15 | 5 |

TABLE 3D

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05<br>GeH$_4$/He = 0.5<br>B$_2$H$_6$/He = 10$^{-3}$<br>NH$_3$ | GeH$_4$ = 50 | SiH$_4$/GeH$_4$ = 1/100<br>B$_2$H$_6$/(GeH$_4$ + SiH$_4$) = 5 × 10$^{-3}$<br>NH$_3$/(GeH$_4$ + SiH$_4$) = 1/100 | 0.18 | 5 | 2 |
| | Second layer | SiH$_4$/He = 0.5<br>B$_2$H$_6$/He = 10$^{-3}$ | SiH$_4$ = 200 | B$_2$H$_6$/SiH$_4$ = 2 × 10$^{-4}$ | 0.18 | 15 | 20 |

TABLE 4D

| Sample No. | 401D | 302D | 403D | 404D | 405D | 506D | 407D | 408D |
|---|---|---|---|---|---|---|---|---|
| GeH$_4$/SiH$_4$ Flow rate ratio | 5/100 | 1/10 | 2/10 | 4/10 | 5/10 | 7/10 | 8/10 | 1/1 |
| Ge content (atomic %) | 4.3 | 8.4 | 15.4 | 26.7 | 32.3 | 38.9 | 42 | 47.6 |
| Evaluation | ⊚ | ⊚ | ⊚ | ⊚ | ⊚ | ○ | ○ | ○ |

⊚: Excellent  ○: Good

TABLE 5D

| Sample No. | 501D | 502D | 503D | 504D | 505D | 506D | 507D | 508D |
|---|---|---|---|---|---|---|---|---|
| Layer thickness | 30Å | 500Å | 0.1$\mu$ | 0.3$\mu$ | 0.8$\mu$ | 3$\mu$ | 4$\mu$ | 5$\mu$ |
| Evaluation | △ | ○ | ⊚ | ⊚ | ⊚ | ○ | ○ | △ |

⊚: Excellent
○: Good
△: Practically satisfactory

TABLE 6D (Sample No. 601D)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 5/10<br>B$_2$H$_6$/(GeH$_4$ + SiH$_4$) = 5 × 10$^{-3}$<br>NH$_3$/(GeH$_4$ + SiH$_4$) = 1/100 | 0.18 | 5 | 2 |
| | Second layer | SiH$_4$/He = 0.5<br>PH$_3$/He = 10$^{-3}$ | SiH$_4$ = 200 | PH$_3$/SiH$_4$ = 9 × 10$^{-5}$ | 0.18 | 15 | 20 |
| Layer (II) | | SiH$_4$/He = 0.5<br>C$_2$H$_4$ | SiH$_4$ = 100 | SiH$_4$/C$_2$H$_4$ = 3/7 | 0.18 | 10 | 0.5 |

: Good

TABLE 7D (Sample No. 602D)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 1/10<br>B$_2$H$_6$/(GeH$_4$ + SiH$_4$) = 8 × 10$^{-4}$<br>NH$_3$/(GeH$_4$ + SiH$_4$) = 1/100 | 0.18 | 5 | 15 |

TABLE 7D-continued (Sample No. 602D)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| | Second layer | NH$_3$ SiH$_4$/He = 0.5 PH$_3$/He = 10$^{-3}$ | SiH$_4$ = 200 | PH$_3$/SiH$_4$ = 1 × 10$^{-5}$ | 0.18 | 15 | 5 |
| Layer (II) | | SiH$_4$/He = 0.5 C$_2$H$_4$ | SiH$_4$ = 100 | SiH$_4$/C$_2$H$_4$ = 3/7 | 0.18 | 10 | 0.5 |

TABLE 8D (Sample No. 603D)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05 GeH$_4$/He = 0.05 B$_2$H$_6$/He = 10$^{-3}$ NH$_3$ | SiH$_4$ + GeH$_4$ = 50 | GeH$_4$/SiH$_4$ = 3/10 B$_2$H$_6$/(GeH$_4$ + SiH$_4$) = 3 × 10$^{-3}$ NH$_3$/(GeH$_4$ + SiH$_4$) = 3/100 | 0.18 | 5 | 1 |
| | Second layer | SiH$_4$/He = 0.5 B$_2$H$_6$/He = 10$^{-3}$ | SiH$_4$ = 200 | B$_2$H$_6$/SiH$_4$ = 3 × 10$^{-4}$ | 0.18 | 15 | 20 |
| Layer (II) | | SiH$_4$/He = 0.5 C$_2$H$_4$ | SiH$_4$ = 100 | SiH$_4$/C$_2$H$_4$ = 3/7 | 0.18 | 10 | 0.5 |

TABLE 9D (Sample No. 701D)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05 GeH$_4$/He = 0.05 B$_2$H$_6$/He = 10$^{-3}$ NH$_3$ | SiH$_4$ + GeH$_4$ = 50 | GeH$_4$/SiH$_4$ = 1/10 B$_2$H$_6$/(GeH$_4$ + SiH$_4$) = 1 × 10$^{-5}$ NH$_3$/(GeH$_4$ + SiH$_4$) = 3/100 | 0.18 | 5 | 1 |
| | Second layer | SiH$_4$/He = 0.05 GeH$_4$/He = 0.05 B$_2$H$_6$/He = 10$^{-3}$ | SiH$_4$ + GeH$_4$ = 50 | GeH$_4$/SiH$_4$ = 1/10 B$_2$H$_6$/(GeH$_4$ + SiH$_4$) = 1 × 10$^{-5}$ | 0.18 | 5 | 19 |
| | Third layer | SiH$_4$/He = 0.5 B$_2$H$_6$/He = 10$^{-3}$ | SiH$_4$ = 200 | B$_2$H$_6$/SiH$_4$ = 3 × 10$^{-4}$ | 0.18 | 15 | 5 |

TABLE 10D (Sample No. 702D)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05 GeH$_4$/He = 0.05 B$_2$H$_6$/He = 10$^{-3}$ NH$_3$ | SiH$_4$ + GeH$_4$ = 50 | GeH$_4$/SiH$_4$ = 3/10 B$_2$H$_6$/(GeH$_4$ + SiH$_4$) = 1 × 10$^{-5}$ NH$_3$/SiH$_4$ = 3/100 | 0.18 | 5 | 1 |
| | Second layer | SiH$_4$/He = 0.05 GeH$_4$/He = 0.05 NH$_3$ | SiH$_4$ + GeH$_4$ = 50 | GeH$_4$/SiH$_4$ = 3/10 NH$_3$/SiH$_4$ = 3/100 | 0.18 | 5 | 1 |
| | Third layer | SiH$_4$/He = 0.5 NH$_3$ B$_2$H$_6$/He = 10$^{-3}$ | SiH$_4$ = 200 | NH$_3$/SiH$_4$ = 3/100 B$_2$H$_6$/SiH$_4$ = 1 × 10$^{-4}$ | 0.18 | 15 | 1 |
| | Fourth layer | SiH$_4$/He = 0.5 B$_2$H$_6$/He = 10$^{-3}$ | SiH$_4$ = 200 | B$_2$H$_6$/SiH$_4$ = 1 × 10$^{-4}$ | 0.18 | 15 | 15 |

TABLE 11D (Sample No. 801D)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05 GeH$_4$/He = 0.05 B$_2$H$_6$/He = 10$^{-3}$ NH$_3$ | SiH$_4$ + GeH$_4$ = 50 | GeH$_4$/SiH$_4$ = 3/10 B$_2$H$_6$/(GeH$_4$ + SiH$_4$) = 3 × 10$^{-3}$ NH$_3$/(GeH$_4$ + SiH$_4$) = 3/100~2.83/100 | 0.18 | 5 | 1 |
| | Second layer | SiH$_4$/He = 0.05 GeH$_4$/He = 0.05 NH$_3$ | SiH$_4$ + GeH$_4$ = 50 | G$_2$H$_4$/SiH$_4$ = 3/10 NH$_3$/(GeH$_4$ + SiH$_4$) = 2.83/100~0 | 0.18 | 5 | 1 |
| | Third | SiH$_4$/He = 0.5 | SiH$_4$ = 200 | | 0.18 | 5 | 19 |

TABLE 11D-continued (Sample No. 801D)

| Layer constitution | Gases employed | Flow rate (SCCM) | Flow rate ratio | Discharging power (W/cm$^2$) | Layer formation (Å/sec) | Layer thickness($\mu$) |
|---|---|---|---|---|---|---|
| layer | | | | | | |

The flow rate ratio $NH_3/(GeH_4 + SiH_4)$ was reduced linearly.

TABLE 12D (Sample No. 802D)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 1/10$<br>$B_2H_6/(GeH_4 + SiH_4) = 3 \times 10^{-3}$<br>$NH_3/(GeH_4 + SiH_4) = 3/100\sim0$ | 0.18 | 5 | 0.5 |
| | Second layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 1/10$<br>$B_2H_6/(GeH_4 + SiH_4) = 3 \times 10^{-3}$ | 0.18 | 5 | 0.5 |
| | Third layer | $SiH_4/He = 0.5$<br>$GeH_4/He = 0.05$ | $SiH_4 + GeH_4 = 50$ | $GeH_4/SiH_4 = 1/10$ | 0.18 | 5 | 19 |
| | Fourth layer | $SiH_4/He = 0.5$ | $SiH_4 = 200$ | | 0.18 | 15 | 5 |

TABLE 13D (Sample No. 803D)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 3/10$<br>$B_2H_6/(GeH_4 + SiH_4) = 5 \times 10^{-3}$<br>$NH_3/(GeH_4 + SiH_4) = 1/100\sim0$ | 0.18 | 5 | 1 |
| | Second layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 3/10$<br>$B_2H_6/(GeH_4 + SiH_4) = 5 \times 10^{-3}$ | 0.18 | 5 | 1 |
| | Third layer | $SiH_4/He = 0.5$<br>$B_2H_6/He = 10^{-3}$ | $SiH_4 = 200$ | $B_2H_6/SiH_4 = 2 \times 10^{-4}$ | 0.18 | 15 | 20 |

TABLE 14D (Sample No. 804D)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 3/10$<br>$B_2H_6/SiH_4 = 3 \times 10^{-3}$<br>$NH_3/SiH_4 = 3/100\sim2.83/100$ | 0.18 | 5 | 1 |
| | Second layer | $SiH_4/He = 0.05$<br>$NH_3$<br>$B_2H_6/He = 10^{-3}$ | $SiH_4 = 200$ | $NH_3/SiH_4 = 2.83/100\sim0$<br>$B_2H_6/SiH_4 = 3 \times 10^{-4}$ | 0.18 | 15 | 20 |

The flow rate ratio $NH_3/SiH_4$ was reduced.

TABLE 15D (Sample No. 805D)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 1/10$<br>$B_2H_6/(GeH_4 + SiH_4) = 1 \times 10^{-5}$<br>$NH_3/(GeH_4 + SiH_4) = 3/100\sim0$ | 0.18 | 5 | 1 |
| | Second layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 1/10$<br>$B_2H_6/(GeH_4 + SiH_4) = 1 \times 10^{-5}$ | 0.18 | 5 | 19 |
| | Third layer | $SiH_4/He = 0.5$<br>$B_2H_6/He = 10^{-3}$ | $SiH_4 = 200$ | $B_2H_6/SiH_4 = 3 \times 10^{-4}$ | 0.18 | 15 | 5 |

The flow rate ratio $NH_3/(GeH_4/SiH_4)$ was reduced linearly.

TABLE 16D

| Condition | Gases employed | Flow rate (SCCM) | Flow rate ratio or Area ratio | Discharging power (W/cm$^2$) | Layer thickness($\mu$) |
|---|---|---|---|---|---|
| 12-1D | Ar | 200 | Si wafer:graphite = 1.5:8.5 | 0.3 | 0.5 |
| 12-2D | Ar | 200 | Si wafer:graphite = 0.5:9.5 | 0.3 | 0.3 |
| 12-3D | Ar | 200 | Si wafer: graphite = 6:4 | 0.3 | 1.0 |
| 12-4D | SiH$_4$/He = 1 C$_2$H$_4$ | SiH$_4$ = 15 | SiH$_4$:C$_2$H$_4$ = 0.4:9.6 | 0.18 | 0.3 |
| 12-5D | SiH$_4$/He = 0.5 C$_2$H$_4$ | SiH$_4$ = 100 | SiH$_4$:C$_2$H$_4$ = 5:5 | 0.18 | 1.5 |
| 12-6D | SiH$_4$/He = 0.5 SiF$_4$/He = 0.5 C$_2$H$_4$ | SiH$_4$ + SiF$_4$ = 150 | SiH$_4$:SiF$_4$:C$_2$H$_4$ = 1.5:1.5:7 | 0.18 | 0.5 |
| 12-7D | SiH$_4$/He = 0.5 SiF$_4$/He = 0.5 C$_2$H$_4$ | SiH$_4$ + SiF$_4$ = 15 | SiH$_4$:SiF$_4$:C$_2$H$_4$ = 0.3:0.1:9.6 | 0.18 | 0.3 |
| 12-8D | SiH$_4$/He = 0.5 SiF$_4$/He = 0.5 C$_2$H$_4$ | SiH$_4$ + SiF$_4$ = 150 | SiH$_4$:SiF$_4$:C$_2$H$_4$ = 3:3:4 | 0.18 | 1.5 |

TABLE 17D

| Preparation condition for layer (II) | Sample No./Evaluation | | |
|---|---|---|---|
| 12-1D | 12-401D ○ ○ | 12-701D ○ ○ | 12-801D ○ ○ |
| 12-2D | 12-402D ○ ○ | 12-702D ○ ○ | 12-802D ○ ○ |
| 12-3D | 12-403D ○ ○ | 12-703D ○ ○ | 12-803D ○ ○ |
| 12-4D | 12-404D ⊙ ⊙ | 12-704D ⊙ ⊙ | 12-804D ⊙ ⊙ |
| 12-5D | 12-405D ⊙ ⊙ | 12-705D ⊙ ⊙ | 12-805D ⊙ ⊙ |
| 12-6D | 12-406D ⊙ ⊙ | 12-706D ⊙ ⊙ | 12-806D ⊙ ⊙ |
| 12-7D | 12-407D ○ ○ | 12-707D ○ ○ | 12-807D ○ ○ |
| 12-8D | 12-408D ○ ○ | 12-708D ○ ○ | 12-808D ○ ○ |

Sample No.
Overal image evaluation   Durability evaluation
Education standard:
⊙: Excellent
○: Good

TABLE 18D

| Sample No. | 1301D | 1302D | 1303D | 1304D | 1305D | 1306D | 1307D |
|---|---|---|---|---|---|---|---|
| Si:C target (area ratio) | 9:1 | 6.5:3.5 | 4:6 | 2:8 | 1:9 | 0.5:9.5 | 0.2:9.8 |
| Si:C (content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊙ | ⊙ | ○ | Δ | x |

⊙: Very good
○: Good
Δ: Sufficiently practically usable
x: Image defect formed

TABLE 19D

| Sample No. | 1401D | 1402D | 1403D | 1404D | 1405D | 1406D | 1407D | 1408D |
|---|---|---|---|---|---|---|---|---|
| SiH$_4$:C$_2$H$_4$ (flow rate ratio) | 9:1 | 6:4 | 4:6 | 2:8 | 1:9 | 0.5:9.5 | 0.35:9.65 | 0.2:9.8 |
| Si:C (content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Sufficiently practically usable
x: Image defect formed

TABLE 20D

| Sample No. | 1501D | 1502D | 1503D | 1504D | 1505D | 1506D | 1507D | 1508D |
|---|---|---|---|---|---|---|---|---|
| SiH$_4$:SiF$_4$:C$_2$H$_4$ (flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (content ratio) | 9:1 | 7:3 | 5.5:4.5 | 4:6 | 3:7 | 2:8 | 1.2:8.8 | 0.8:9.2 |
| Image quality | Δ | ○ | ⊙ | ⊙ | ⊙ | ○ | Δ | x |

TABLE 20D-continued

| Sample No. | 1501D | 1502D | 1503D | 1504D | 1505D | 1506D | 1507D | 1508D |
|---|---|---|---|---|---|---|---|---|
| evaluation | | | | | | | | |

⊚: very good
○: Good
Δ: Practically satisfactory
x: Image defect formed

TABLE 21D

| Sample No. | Thickness of layer (II) (μ) | Results |
|---|---|---|
| 1601D | 0.001 | Image defect liable to occur |
| 1602D | 0.02 | No image defect during 20,000 repetitions |
| 1603D | 0.05 | Stable for 50,000 repetitions |
| 1604D | 1 | Stable for 200,000 repetitions |

TABLE 4E-continued

| Sample No. | 401E | 402E | 403E | 404E | 405E | 406E | 407E |
|---|---|---|---|---|---|---|---|
| Evaluation | Δ | ○ | ⊚ | ⊚ | ⊚ | ○ | Δ |

⊚: Excellent
○: Good
Δ: Practically satisfactory

TABLE 1E

| Layer constitution | | Gases employed | Flow rate (SCCM) | Flow rate ratio | Discharging power (W/cm$^2$) | Layer formation (Å/sec) | Layer thickness(μ) |
|---|---|---|---|---|---|---|---|
| Layer (I) | First layer | $SiH_4/He = 0.05$ $GeH_4/He = 0.05$ $NH_3$ | $SiH_4 + GeH_4 = 50$ | $GeH_4/SiH_4 = 1/1$ $NH_3/(GeH_4 + SiH_4) = 2/100$ | 0.18 | 5 | 3 |
| | Second layer | $SiH_4/He = 0.5$ | $SiH_4 = 200$ | | 0.18 | 15 | 15 |
| Layer (II) | | $SiH_4/He = 0.5$ NO | $SiH_4 = 100$ | $SiH_4/NO = 1$ | 0.18 | 10 | 0.5 |

TABLE 2E

| Layer constitution | | Gases employed | Flow rate (SCCM) | Flow rate ratio | Discharging power (W/cm$^2$) | Layer formation (Å/sec) | Layer thickness(μ) |
|---|---|---|---|---|---|---|---|
| Layer (I) | First layer | $SiH_4/He = 0.05$ $GeH_4/He = 0.05$ $NH_3$ | $SiH_4 + GeH_4 = 50$ | $GeH_4/SiH_4 = 1/10$ $NH_3/(GeH_4 + SiH_4) = 3/100 \sim 0$ (linearly reduced) | 0.18 | 5 | 5 |
| | Second layer | $SiH_4/He = 0.05$ $GeH_4/He = 0.05$ | $SiH_4 + GeH_4 = 50$ | $GeH_4/SiH_4 = 1/10$ | 0.18 | 5 | 1 |
| | Third layer | $SiH_4/He = 0.5$ | $SiH_4 = 200$ | | 0.18 | 15 | 15 |

TABLE 3E

| Layer constitution | | Gases employed | Flow rate (SCCM) | Flow rate ratio | Discharging power (W/cm$^2$) | Layer formation (Å/sec) | Layer thickness(μ) |
|---|---|---|---|---|---|---|---|
| Layer (I) | First layer | $GeH_4/He = 0.5$ $NH_3$ $B_2H_6/He = 10^{-3}$ | $GeH_4 = 50$ | $NH_3/GeH_4 = 2/100$ | 0.18 | 5 | 2 |
| | Second layer | $SiH_4/He = 0.5$ $NH_3$ | $SiH_4 = 200$ | $NH_3/SiH_4 = 2/100$ $B_2H_6/SiH_4 = 1 \times 10^{-5}$ | 0.18 | 15 | 2 |
| | Third layer | $SiH_4/He = 0.5$ $B_2H_6/He = 10^{-3}$ | $SiH_4 = 200$ | $B_2H_6/SiH_4 = 1 \times 10^{-5}$ | 0.18 | 15 | 15 |

TABLE 4E

| Sample No. | 401E | 402E | 403E | 404E | 405E | 406E | 407E |
|---|---|---|---|---|---|---|---|
| Ge content (atomic %) | 1 ○ | 3 ⊚ | 5 ⊚ | 10 ⊚ | 40 ○ | 60 ○ | 90 ○ |

TABLE 5E

| Sample No. | 501E | 502E | 503E | 504E | 505E |
|---|---|---|---|---|---|
| Layer thickness(μ) | 0.1 | 0.5 | 1 | 2 | 5 |
| Evaluation | ○ | ○ | ⊚ | ⊚ | ○ |

⊚: Excellent
○: Good

TABLE 6E

| Layer constitution | | Gases employed | Flow rate (SCCM) | Flow rate ratio | Discharging power (W/cm$^2$) | Layer formation (Å/sec) | Layer thickness(μ) |
|---|---|---|---|---|---|---|---|
| Layer (I) | First layer | $SiH_4/He = 0.05$ $GeH_4/He = 0.05$ $NH_3$ | $SiH_4 + GeH_4 = 50$ | $GeH_4/SiH_4 = 4/10$ $NH_3/(GeH_4 + SiH_4) = 2/100$ | 0.18 | 5 | 2 |
| | Second | $SiH_4/He = 0.5$ $PH_3/He = 10^{-3}$ | $SiH_4 = 200$ | $PH_3/SiH_4 = 1 \times 10^{-7}$ | 0.18 | 15 | 20 |
| Layer (II) | | $SiH_4/He = 0.5$ | $SiH_4 = 100$ | $SiH_4/NO = 1$ | 0.15 | 10 | 0.5 |

TABLE 6E-continued

| Layer constitution | Gases employed | Flow rate (SCCM) | Flow rate ratio | Discharging power (W/cm$^2$) | Layer formation (Å/sec) | Layer thickness(μ) |
|---|---|---|---|---|---|---|
| | NO | | | | | |

TABLE 7E

| Conditions | Gases employed | Flow rate (SCCM) | Flow rate ratio or Area ratio | Discharging power (W/cm$^2$) | Layer thickness(μ) |
|---|---|---|---|---|---|
| 11-1E | Ar (NO/Ar) | 200 (1/1) | Si wafer:SiO$_2$ = 1:30 | 0.3 | 0.5 |
| 11-2E | Ar (NO/Ar) | 200 (1/1) | Si wafer:SiO$_2$ = 1:60 | 0.3 | 0.3 |
| 11-3E | Ar (NO/Ar) | 200 (1/1) | Si wafer:SiO$_2$ = 6:4 | 0.3 | 1.0 |
| 11-4E | SiH$_4$/He = 1 NO | SiH$_4$ = 15 | SiH$_4$:NO = 5:1 | 0.18 | 0.3 |
| 11-5E | SiH$_4$/He = 0.5 NO | SiH$_4$ = 100 | SiH$_4$:NO = 1:1 | 0.18 | 1.5 |
| 11-6E | SiH$_4$/He = 0.5 SiF$_4$/He = 0.5 NO | SiH$_4$ + SiF$_4$ = 150 | SiH$_4$:SiF$_4$:NO = 1:1:1 | 0.18 | 0.5 |
| 11-7E | SiH$_4$/He = 0.5 SiF$_4$/He = 0.5 NO | SiH$_4$ + SiF$_4$ = 15 | SiH$_4$:SiF$_4$:NO = 2:1:4 | 0.18 | 0.3 |
| 11-8E | SiH$_4$/He = 0.5 SiF$_4$/He = 0.5 NO | SiH$_4$ + SiF$_4$ = 150 | SiH$_4$:SiF$_4$:NO 1:1:3 | 0.18 | 1.5 |

TABLE 8E

| Preparation condition for layer (II) | Sample No./Evaluation | | |
|---|---|---|---|
| 11-1E | 11-201E ○ ○ | 11-301E ○ ○ | 11-601E ○ ○ |
| 11-2E | 11-202E ○ ○ | 11-302E ○ ○ | 11-602E ○ ○ |
| 11-3E | 11-203E ○ ○ | 11-303E ○ ○ | 11-603E ○ ○ |
| 11-4E | 11-204E ⊚ ⊚ | 11-304E ⊚ ⊚ | 11-604E ⊚ ⊚ |
| 11-5E | 11-205E ⊚ ⊚ | 11-305E ⊚ ⊚ | 11-605E ⊚ ⊚ |
| 11-6E | 11-206E ⊚ ⊚ | 11-306E ⊚ ⊚ | 11-606E ⊚ ⊚ |
| 11-7E | 11-207E ○ ○ | 11-307E ○ ○ | 11-607E ○ ○ |
| 11-8E | 11-208E ○ ○ | 11-308E ○ ○ | 11-608E ○ ○ |

Sample No.
Overal image evaluation   Durability evaluation
Education standard:
⊚: Excellent
○: Good

TABLE 9E

| Sample No. | 1201E | 1202E | 1203E | 1204E | 1205E | 1206E | 1207E |
|---|---|---|---|---|---|---|---|
| Si:SiO$_2$ target (area ratio) (NO/Ar) | 9:1 (0/1) | 6.5:3.5 (1/1) | 4:10 (1/1) | 2:20 (1/1) | 1:100 (2/1) | 1.100 (3/1) | 1.100 (4/1) |
| Si:O (content ratio) | 9.7:0.3 | 8.8:1.2 | 7.3:2.7 | 5.0:5.0 | 4.5:5.5 | 4:6 | 3:7 |
| Image quality evaluation | Δ | ⊚ | ⊚ | ○ | ○ | Δ | x |

⊚: Very good
○: Good
Δ: Sufficiently practically usable
x: Image defect formed

TABLE 10E

| Sample No. | 1301E | 1302E | 1303E | 1304E | 1305E | 1306E | 1307E |
|---|---|---|---|---|---|---|---|
| SiH$_4$:NO (Flow rate ratio) | 1000:1 | 99:1 | 5:1 | 1:1 | 1:2 | 3:10 | 1:1000 |
| Si:O (content ratio) | 9.9999:0.0001 | 9.9:01 | 9:1 | 6:4 | 5:5 | 3.3:6.7 | 2:8 |
| Image quality evaluation | Δ | ○ | ⊚ | ⊚ | ○ | Δ | x |

⊚: Very good
○: Good
Δ: Practically satisfactory
x: Image defect formed

TABLE 11E

| Sample No. | 1401E | 1402E | 1403E | 1404E | 1405E | 1406E | 1407E |
|---|---|---|---|---|---|---|---|
| $SiH_4:SiF_4:NO$ (Flow rate ratio) | 500:400:1 | 50:50:1 | 5:5:2 | 5:5:10 | 1:1:4 | 3:3:20 | 1:1:2000 |
| Si:O (content ratio) | 9.9998:0.0002 | 9.8:0.2 | 8.8:1.2 | 6.3:3.7 | 5.1:4.9 | 3.5:6.5 | 2.3:7.7 |
| Image quality evaluation | Δ | ◯ | ⊚ | ⊚ | ◯ | x | Δ |

⊚: Very good
◯: Good
Δ: Practically satisfactory
x: Image defect formed

TABLE 12E

| Sample No. | Thickness of second layer (II) | Results |
|---|---|---|
| 1601E | 0.001 | Image defect liable to occur |
| 1602E | 0.02 | No image defect during 20,000 repetitions |
| 1603E | 0.05 | Stable for 50,000 repetitions |
| 1604E | 1 | Stable for 200,000 repetitions |

TABLE 1F

| Layer constitution | | Gases employed | Flow rate (SCCM) | Flow rate ratio | Discharging power (W/cm²) | Layer formation (Å/sec) | Layer thickness(μ) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 3/10$<br>$B_2H_6/(GeH_4 + SiH_4) = 3 \times 10^{-3}$<br>$NH_3/(GeH_4 + SiH_4) = 3/100$ | 0.18 | 5 | 1 |
| | Second layer | $SiH_4/He = 0.5$ | $SiH_4 = 200$ | | 0.18 | 15 | 20 |
| Layer (II) | | $SiH_4/He = 0.5$<br>NO | $SiH_4 = 100$ | $SiH_4/NO = 1$ | 0.18 | 10 | 0.5 |

TABLE 2F

| Layer constitution | | Gases employed | Flow rate (SCCM) | Flow rate ratio | Discharging power (W/cm²) | Layer formation (Å/sec) | Layer thickness(μ) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 1/10$<br>$B_2H_6/(GeH_4 + SiH_4) = 3 \times 10^{-3}$<br>$NH_3/(GeH_4 + SiH_4) = 3/100$ | 0.18 | 5 | 1 |
| | Second layer | $SiH_4/He = 0.05$<br>$GeH_4/He = 0.05$ | $SiH_4 + GeH_4 = 50$ | $GeH_4 + SiH_4 = 1/10$ | 0.18 | 5 | 19 |
| | Third layer | $SiH_4/He = 0.5$ | $SiH_4 = 200$ | | 0.18 | 15 | 5 |

TABLE 3F

| Layer constitution | | Gases employed | Flow rate (SCCM) | Flow rate ratio | Discharging power (W/cm²) | Layer formation (Å/sec) | Layer thickness(μ) |
|---|---|---|---|---|---|---|---|
| Layer (I) | First layer | $GeH_4/He = 0.05$<br>$B_2H_6/He = 10^{-3}$<br>$NH_3$ | $GeH_4 = 50$ | $B_2H_6/GeH_4 = 5 \times 10^{-3}$<br>$NH_3/GeH_4 = 1/100$ | 0.18 | 5 | 2 |
| | Second layer | $SiH_4/He = 0.5$<br>$B_2H_6/He = 10^{-3}$ | $SiH_4 = 200$ | $B_2H_6/SiH_4 = 2 \times 10^{-4}$ | 0.18 | 15 | 20 |

TABLE 4F

| Sample No. | 401E | 402E | 403E | 404E | 405E | 406E | 407E | 408E |
|---|---|---|---|---|---|---|---|---|
| $GeH_4 + SiH_4$ (Flow rate ratio) | 5/100 | 1/10 | 2/10 | 4/10 | 5/10 | 7/10 | 8/10 | 1/1 |
| Ge content (atomic %) | 4.3 | 8.4 | 15.4 | 26.7 | 32.2 | 38.9 | 42 | 47.6 |
| Evaluation | ⊚ | ⊚ | ⊚ | ⊚ | ⊚ | ⊚ | ◯ | ◯ |

⊚: Excellent
◯: Good

TABLE 5F

| Sample No. | 501E | 502E | 503E | 504E | 505E | 506E | 507E | 508E |
|---|---|---|---|---|---|---|---|---|
| Layer thickness($\mu$) | 30Å | 500Å | 0.1$\mu$ | 0.3$\mu$ | 0.8$\mu$ | 3$\mu$ | 4$\mu$ | 5$\mu$ |
| Evaluation | △ | ○ | ⊙ | ⊙ | ⊙ | ○ | ○ | △ |

⊙: Excellent
○: Good
△: Practically satisfactory

TABLE 6F (Sample No. 601F)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 5/10<br>B$_2$H$_6$/(GeH$_4$ + SiH$_4$) = 5 × 10$^{-3}$<br>NH$_3$/(GeH$_4$ + SiH$_4$) = 1/100 | 0.18 | 5 | 2 |
| | Second layer | SiH$_4$/He = 0.5<br>PH$_3$/He = 10$^{-3}$ | SiH$_4$ = 200 | PH$_3$/SiH$_4$ = 9 × 10$^{-5}$ | 0.18 | 15 | 20 |
| Layer (II) | | SiH$_4$/He = 0.5<br>NO | SiH$_4$ = 100 | SiH$_4$/NO = 1 | 0.18 | 10 | 0.5 |

TABLE 7F (Sample No. 602F)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10<br>B$_2$H$_6$/(GeH$_4$ + SiH$_4$) = 8 × 10$^{-4}$<br>NH$_3$/(GeH$_4$ + SiH$_4$) = 1/100 | 0.18 | 5 | 15 |
| | Second layer | SiH$_4$/He = 0.5<br>PH$_3$/He = 10$^{-3}$ | SiH$_4$ = 200 | PH$_3$/SiH$_4$ = 1 × 10$^{-5}$ | 0.18 | 15 | 5 |
| Layer (II) | | SiH$_4$/He = 0.5<br>NO | SiH$_4$ = 100 | SiH$_4$/NO = 1 | 0.18 | 10 | 0.5 |

TABLE 8F (Sample No. 603F)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 3/10<br>B$_2$H$_6$/(GeH$_4$ + SiH$_4$) = 3 × 10$^{-3}$<br>NH$_3$/(GeH$_4$ + SiH$_4$) = 3/100 | 0.18 | 5 | 1 |
| | Second layer | SiH$_4$/He = 0.5<br>B$_2$H$_6$/He = 10$^{-3}$ | SiH$_4$ = 200 | B$_2$H$_6$/SiH$_4$ = 3 × 10$^{-4}$ | 0.18 | 15 | 20 |
| Layer (II) | | SiH$_4$/He = 0.5<br>NO | SiH$_4$ = 100 | SiH$_4$/NO = 1 | 0.18 | 10 | 0.5 |

TABLE 9F (Sample No. 701F)

| Layer constitution | | Gases employed | Flow rate (SCCM) | Flow rate ratio | Discharging power (W/cm$^2$) | Layer formation rate (Å/sec) | Layer thickness($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10<br>B$_2$H$_6$/(GeH$_4$ + SiH$_4$) = 1 × 10$^{-5}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 1/10<br>B$_2$H$_6$/(GeH$_4$ + SiH$_4$) = 1 × 10$^{-5}$ | 0.18 | 5 | 19 |
| | Third layer | SiH$_4$/He = 0.5<br>B$_2$H$_6$/He = 10$^{-3}$ | SiH$_4$ = 200 | B$_2$H$_6$/SiH$_4$ = 3 × 10$^{-4}$ | 0.18 | 15 | 5 |

TABLE 10F (Sample No. 702F)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 3/10<br>B$_2$H$_6$/(GeH$_4$ + SiH$_4$) = 1 × 10$^{-5}$<br>NH$_3$/SiH$_4$ = 3/100 | 0.18 | 5 | 1 |
| | Second layer | SiH$_4$/He = 0.05<br>GeH$_4$/He = 0.05<br>NH$_3$ | SiH$_4$ + GeH$_4$ = 50 | GeH$_4$/SiH$_4$ = 3/10<br>NH$_3$/SiH$_4$ = 3/100 | 0.18 | 5 | 1 |
| | Third layer | SiH$_4$/He = 0.5<br>NH$_3$<br>B$_2$H$_6$/He = 10$^{-3}$ | SiH$_4$ = 200 | NH$_3$/SiH$_4$ = 3/100<br>B$_2$H$_6$/SiH$_4$ = 1 × 10$^{-4}$ | 0.18 | 15 | 1 |
| | Fourth layer | SiH$_4$/He = 0.5<br>B$_2$H$_6$/He = 10$^{-3}$ | SiH$_4$ = 200 | B$_2$H$_6$/SiH$_4$ = 1 × 10$^{-4}$ | 0.18 | 15 | 15 |

TABLE 11F (Sample No. 801F)

| Layer constitution | | Gases employed | Flow rate (SCCM) | Flow rate ratio | Discharging power (W/cm$^2$) | Layer formation rate (Å/sec) | Layer thickness($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 3/10<br>B$_2$H$_6$/(GeH$_4$ + SiH$_4$) = 3 × 10$^{-3}$<br>NH$_3$/(GeH$_4$ + SiH$_4$) = 3/100~2.83/100 | 0.18 | 5 | 1 |
| | Second layer | SiH$_4$/He = 0.05<br>GeH$_4$/He = 0.05<br>NH$_3$ | SiH$_4$ + GeH$_4$ = 50 | GeH$_4$/SiH$_4$ = 3/10<br>NH$_3$/(GeH$_4$ + SiH$_4$) = 2.83/100~0 | 0.18 | 5 | 1 |
| | Third layer | SiH$_4$/He = 0.5 | SiH$_4$ = 200 | | 0.18 | 15 | 19 |

The flow rate ratio NH$_3$/(GeH$_4$ + SiH$_4$) was reduced linearly.

TABLE 12F (Sample No. 802F)

| Layer constitution | | Gases employed | Flow rate (SCCM) | Flow rate ratio | Discharging power (W/cm$^2$) | Layer formation (Å/sec) | Layer thickness($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10<br>B$_2$H$_6$/(GeH$_4$ + SiH$_4$) = 3 × 10$^{-3}$<br>NH$_3$/(GeH$_4$ + SiH$_4$) = 3/100~0 | 0.18 | 5 | 0.5 |
| | Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 1/10<br>B$_2$H$_6$/(GeH$_4$ + SiH$_4$) = 3 × 10$^{-3}$ | 0.18 | 5 | 0.5 |
| | Third layer | SiH$_4$/He = 0.05<br>GeH$_4$/He = 0.05 | SiH$_4$ + GeH$_4$ = 50 | GeH$_4$/SiH$_4$ = 1/10 | 0.18 | 5 | 19 |
| | Fourth layer | SiH$_4$/He = 0.5 | SiH$_4$ = 200 | | 0.18 | 15 | 5 |

TABLE 13F (Sample No. 803F)

| Layer constitution | | Gases employed | Flow rate (SCCM) | Flow rate ratio | Discharging power (W/cm$^2$) | Layer formation rate (Å/sec) | Layer thickness($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ +GeH$_4$ = 50 | GeH$_4$/SiH$_4$ = 3/10<br>B$_2$H$_6$/(GeH$_4$ + SiH$_4$) = 5 × 10$^{-3}$<br>NH$_3$/(GeH$_4$ + SiH$_4$) = 1/100~0 | 0.18 | 5 | 1 |
| | Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 3/10<br>B$_2$H$_6$/(GeH$_4$ + SiH$_4$) = 5 × 10$^{-3}$ | 0.18 | 5 | 1 |
| | Third layer | SiH$_4$/He = 0.5<br>B$_2$H$_6$/He = 10$^{-3}$ | SiH$_4$ = 200 | B$_2$H$_6$/SiH$_4$ = 2 × 10$^{-4}$ | 0.18 | 15 | 20 |

TABLE 14F (Sample No. 804F)

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First | SiH$_4$/He = 0.05 | SiH$_4$ + GeH$_4$ = 50 | GeH$_4$/SiH$_4$ = 3/10 | 0.18 | 5 | 1 |

TABLE 14F-continued (Sample No. 804F)

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| layer | GeH$_4$/He = 0.05<br>B$_2$H$_6$/He = 10$^{-3}$<br>NH$_3$ | | B$_2$H$_6$/SiH$_4$ = 3 × 10$^{-3}$<br>NH$_3$/SiH$_4$ = 3/100~2.83/100 | | | |
| Second layer | SiH$_4$/He = 0.5<br>NH$_3$<br>B$_2$H$_6$/He = 10$^{-3}$ | SiH$_4$ = 200 | NH$_3$/SiH$_4$ = 2.83/100~0<br>B$_2$H$_6$SiH$_4$ = 3 × 10$^{-4}$ | 0.18 | 15 | 20 |

The flow rate ratio NH$_3$/SiH$_4$ was reduced linearly.

TABLE 15F (Sample No. 805F)

| Layer constitution | | Gases employed | Flow rate (SCCM) | Flow rate ratio | Discharging power (W/cm$^2$) | Layer formation rate (Å/sec) | Layer thickness($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10<br>B$_2$H$_6$/(GeH$_4$ + SiH$_4$) = 1 × 10$^{-5}$<br>NH$_3$/(GeH$_4$ + SiH$_4$) = 3/100~0 | 0.18 | 5 | 1 |
| | Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_2$/SiH$_4$ = 1/10<br>B$_2$H$_6$/(GeH$_4$ + SiH$_4$) = 1 × 10$^{-5}$ | 0.18 | 5 | 19 |
| | Third layer | SiH$_4$/He = 0.5<br>B$_2$H$_6$/He = 10$^{-3}$ | SiH$_4$ = 200 | B$_2$H$_6$/SiH$_4$ = 3 × 10$^{-4}$ | 0.18 | 15 | 5 |

The flow rate ratio NH$_3$/(GeH$_4$/SiH$_4$) was reduced linearly.

TABLE 16F

| Conditions | Gases employed | Flow rate (SCCM) | Flow rate ratio or Area ratio | Discharging power (W/cm$^2$) | Layer thickness($\mu$) |
|---|---|---|---|---|---|
| 11-1E | Ar (NO/Ar) | 200 (1/1) | Si wafer:SiO$_2$ = 1:30 | 0.3 | 0.5 |
| 11-2E | Ar (NO/Ar) | 200 (1/1) | Si wafer:SiO$_2$ = 1:60 | 0.3 | 0.3 |
| 11-3E | Ar (NO/Ar) | 200 (1/1) | Si wafer:SiO$_2$ = 6:4 | 0.3 | 1.0 |
| 11-4E | SiH$_4$/He = 1<br>NO | SiH$_4$ = 15 | SiH$_4$:NO = 5:1 | 0.18 | 0.3 |
| 11-5E | SiH$_4$/He = 0.5<br>NO | SiH$_4$ = 100 | SiH$_4$:NO = 1:1 | 0.18 | 1.5 |
| 11-6E | SiH$_4$/He = 0.5<br>SiF$_4$/He = 0.5<br>NO | SiH$_4$ + SiF$_4$ = 150 | SiH$_4$:SiF$_4$:NO = 1:1:1 | 0.18 | 0.5 |
| 11-7E | SiH$_4$/He = 0.5<br>SiF$_4$/He = 0.5<br>NO | SiH$_4$ + SiF$_4$ = 15 | SiH$_4$:SiF$_4$:NO = 2:1:4 | 0.18 | 0.3 |
| 11-8E | SiH$_4$/He = 0.5<br>SiF$_4$/He = 0.5<br>NO | SiH$_4$ + SiF$_4$ = 150 | SiH$_4$:SiF$_4$:NO = 1:1:3 | 0.18 | 1.5 |

TABLE 17F

| Preparation condition for layer (II) | Sample No./Evaluation | | | |
|---|---|---|---|---|
| 11-1E | 11-101E ○ ○ | 11-201E ○ ○ | 11-301E ○ ○ | |
| 11-2E | 11-102E ○ ○ | 11-202E ○ ○ | 11-302E ○ ○ | |
| 11-3E | 11-103E ○ ○ | 11-203E ○ ○ | 11-303E ○ ○ | |
| 11-4E | 11-104E ⊙ ⊙ | 11-204E ⊙ ⊙ | 11-304E ⊙ ⊙ | |
| 11-5E | 11-105E ⊙ ⊙ | 11-205E ⊙ ⊙ | 11-305E ⊙ ⊙ | |
| 11-6E | 11-106E ⊙ ⊙ | 11-206E ⊙ ⊙ | 11-306E ⊙ ⊙ | |
| 11-7E | 11-107E ○ ○ | 11-207E ○ ○ | 11-307E ○ ○ | |
| 11-8E | 11-108E ○ ○ | 11-208E ○ ○ | 11-308E ○ ○ | |

Sample No.
Overall image evaluation  Durability evaluation
Education standard:
⊙: Excellent
○: Good

TABLE 18F

| Sample No. | 1201E | 1202E | 1203E | 1204E | 1205E | 1206E | 1207E |
|---|---|---|---|---|---|---|---|
| Si:SiO$_2$ target (area ratio) (NO/Ar) | 9:1 (0/1) | 6.5:3.5 (1/1) | 4:10 (1/1) | 2:20 (1/1) | 1:100 (2/1) | 1:100 (3/1) | 1:100 (4/1) |
| Si:O (content ratio) | 9.7:0.3 | 8.8:1.2 | 7.3:2.7 | 5.0:5.0 | 4.5:5.5 | 4:6 | 3:7 |

TABLE 18F-continued

| Sample No. | 1201E | 1202E | 1203E | 1204E | 1205E | 1206E | 1207E |
|---|---|---|---|---|---|---|---|
| Image quality evaluation | Δ | ⊚ | ⊚ | ○ | ○ | Δ | x |

⊚: Very good
○: Good
Δ: Sufficiently practically usable
x: Image defect formed

TABLE 19F

| Sample No. | 1301E | 1302E | 1303E | 1304E | 1305E | 1306E | 1307E |
|---|---|---|---|---|---|---|---|
| $SiH_4:NO$ (Flow rate ratio) | 1000:1 | 99:1 | 5:1 | 1:1 | 1:2 | 3:10 | 1:1000 |
| Si:O (content ratio) | 9.9999:0.0002 | 9.9:0.1 | 9:1 | 6:4 | 5:5 | 3.3:6.7 | 2:8 |
| Image quality evaluation | Δ | ○ | ⊚ | ⊚ | ○ | Δ | x |

⊚: Very good
○: Good
Δ: Practically satisfactory
x: Image defect formed

TABLE 20F

| Sample No. | 1401E | 1402E | 1403E | 1404E | 1405E | 1406E | 1407E |
|---|---|---|---|---|---|---|---|
| $SiH_4:SiF_4:NO$ (flow rate ratio) | 500:400:1 | 50:50:1 | 5:5:2 | 5:5:10 | 1:1:4 | 3:3:20 | 1:1:2000 |
| Si:O (content ratio) | 9.9998:0.0002 | 9.8:0.2 | 8.8:1.2 | 6.3:3.7 | 5.1:4.9 | 3.5:6.5 | 2.3:7.7 |
| Image quality evaluation | Δ | ○ | ⊚ | ⊚ | ○ | x | Δ |

⊚: Very good
○: Good
Δ: Practically satisfactory
x: Image defect formed

TABLE 21F

| Sample No. | Thickness of layer (II) | Results |
|---|---|---|
| 1601E | 0.001 | Image defect liable to occur |
| 1602E | 0.02 | No image defect during 20,000 repetitions |
| 1603E | 0.05 | Stable for 50,000 repetitions |
| 1604E | 1 | Stable for 200,000 repetitions |

What we claim is:

1. A photoconductive member comprising a substrate for photoconductive member and a light receiving layer provided on said substrate having a layer constitution in which a first layer region (G) comprising an amorphous material containing germanium atoms and at least one of hydrogen atoms and halogen atoms, and a second layer region (S) exhibiting photoconductivity comprising an amorphous material containing silicon atoms and at least one of hydrogen atoms and halogen atoms, are successively provided from the substrate side, said light receiving layer containing nitrogen atoms.

2. A photoconductive member according to claim 1, wherein hydrogen atoms are contained in at least one of the first layer region (G) and the second layer region (S).

3. A photoconductive member according to claim 1, wherein halogen atoms are contained in at least one of the first layer region (G) and the second layer region (S).

4. A photoconductive member according to claim 1, wherein the amount of germanium atoms contained in the first layer region (G) is 1 to $1 \times 10^6$ atomic ppm based on the sum with silicon atoms in the first layer region (G).

5. A photoconductive member according to claim 1, wherein the first layer region (G) has a layer thickness $T_B$ of 30 Å to 50μ.

6. A photoconductive member according to claim 1, wherein the second layer region (S) has a layer thickness T of 0.5 to 90μ.

7. A photoconductive member according to claim 1, wherein there is the relationship between the layer thickness $T_B$ of the first layer region (G) and the layer thickness T of the second layer region (S) of $T_B/T \leq 1$.

8. A photoconductive member according to claim 1, wherein the layer thickness $T_B$ of the first layer region (G) is 30μ or less, when the content of germanium atoms contained in the first layer region (G) is $1 \times 10^5$ atomic ppm or more based on the sum with silicon atoms in the first layer region (G).

9. A photoconductive member according to claim 1, wherein the content of nitrogen atoms in the layer region (N) in which nitrogen atoms are to be contained is 0.001 to 50 atomic %.

10. A photoconductive member according to claim 1, wherein nitrogen atoms are contained in the light receiving layer in such a state that nitrogen atoms are distributed in the layer region (N) in which nitrogen atoms are to be contained ununiformly in its layer thickness direction.

11. A photoconductive member according to claim 1, wherein a substance (C) for controlling conductivity is contained in the light receiving layer.

12. A photoconductive member according to claim 11, wherein the substance (C) for controlling conductivity is an atom belonging to the group III of the periodic table.

13. A photoconductive member according to claim 12, wherein the atom belonging to the group III of the periodic table is selected from among B, Al, Ga, In and Tl.

14. A photoconductive member according to claim 11, wherein the substance (C) for controlling conductivity is an atom belonging to the group V of the periodic table.

15. A photoconductive member according to claim 14, wherein the atom belonging to the group V of the periodic table is selected from among P, As, Sb and Bi.

16. A photoconductive member according to claim 11, wherein the content of the substance (C) for controlling conductivity in the light receiving layer is 0.01 to $5 \times 10^4$ atomic ppm.

17. A photoconductive member according to claim 1, wherein a substance (C) for controlling conductivity is contained in the first layer region (G).

18. A photoconductive member according to claim 17, wherein the content of the substance (C) for controlling conductivity in the first layer region (G) is 0.01 to $5 \times 10^4$ atomic ppm.

19. A photoconductive member according to claim 1, wherein a substance (C) for controlling conductivity is contained in the second layer region (S).

20. A photoconductive member according to claim 19, wherein the content of the substance (C) for controlling conductivity in the second layer region (S) is 0.001 to 1000 atomic ppm.

21. A photoconductive member according to claim 1, wherein 0.01 to 40 atomic % of hydrogen atoms are contained in the first layer region (G).

22. A photoconductive member according to claim 1, wherein 0.01 to 40 atomic % of halogen atoms are contained in the first layer region (G).

23. A photoconductive member according to claim 1, wherein 0.01 to 40 atomic % as the total of hydrogen atoms and halogen atoms are contained in the first layer region (G).

24. A photoconductive member according to claim 1, wherein 1 to 40 atomic % of hydrogen atoms are contained in the second layer region (S).

25. A photoconductive member according to claim 1, wherein 1 to 40 atomic % of halogen atoms are contained in the second layer region (S).

26. A photoconductive member according to claim 1, wherein 1 to 40 atomic % as total of hydrogen atoms and halogen atoms are contained in the second layer region (S).

27. A photoconductive member according to claim 1, wherein the light receiving layer has a layer region (PN) containing a substance (C) for controlling conductivity.

28. A photoconductive member according to claim 27, wherein the layer region (PN) is provided is the end portion layer region on the substrate side of the light receiving layer.

29. A photoconductive member according to claim 27, wherein the layer region (PN) has the bonded interface between the first layer region (G) and the second layer region (S) in its inner portion.

30. A photoconductive member according to claim 27, wherein the layer region (PN) is provided in the second layer region (S).

31. A photoconductive member according to claim 27, wherein the layer region (PN) is provided in the layer region (G).

32. A photoconductive member according to claim 27, wherein the content of the substance (C) for controlling conductivity in the layer region (PN) is 0.01 to $5 \times 10^4$ atomic ppm.

33. A photoconductive member comprising a substrate for photoconductive member and a light receiving layer provided on said substrate consisting of a first layer (I) with a layer constitution in which a first layer region (G) comprising an amorphous material containing germanium atoms and at least one of hydrogen atoms and halogen atoms, and a second layer region (S) exhibiting photoconductivity comprising an amorphous material containing silicon atoms and at least one of hydrogen atoms and halogen atoms, are successively provided from the substrate side and a second layer (II) comprising an amorphous material containing silicon atoms and at least one of carbon atoms and oxygen atoms, said first layer (I) containing nitrogen atoms therein.

34. A photoconductive member according to claim 33, wherein hydrogen atoms are contained in at least one of the first layer region (G) and the second layer region (S).

35. A photoconductive member according to claim 33, wherein halogen atoms are contained in at least one of the first layer region (G) and the second layer region (S).

36. A photoconductive member according to claim 33, wherein the amount of germanium atoms contained in the first layer region (G) is 1 to $1 \times 10^6$ atomic ppm based on the sum with shown silicon atoms in the first layer region (G).

37. A photoconductive member according to claim 33, wherein the first layer region (G) has a layer thickness $T_B$ of 30 Å to 50μ.

38. A photoconductive member according to claim 33, wherein the second layer region (S) has layer thickness T of 0.5 to 90μ.

39. A photoconductive member according to claim 33, wherein there is the relationship between the layer thickness $T_B$ of the first layer region (G) and the layer thickness T of the second layer region (S) of $T_B/T \leq 1$.

40. A photoconductive member according to claim 33, wherein the layer thickness $T_B$ of the first layer region (G) is 30μ or less, when the content of germanium atoms contained in the first layer region (G) is $1 \times 10^5$ atomic ppm or more based on the sum with silicon atoms in the first layer region (G).

41. A photoconductive member according to claim 33, wherein the content of nitrogen atoms in the layer region (N) in which nitrogen atoms are to be contained is 0.001 to 50 atomic %.

42. A photoconductive member according to claim 33, wherein nitrogen atoms are contained in the first layer (I) in such a state that nitrogen atoms are distributed in the layer region (N) in which nitrogen atoms are to be contained ununiformly in its layer thickness direction.

43. A photoconductive member according to claim 33, wherein a substance (C) for controlling conductivity is contained in the first layer (I).

44. A photoconductive member according to claim 43, wherein the substance (C) for controlling conductivity is an atom belonging to the group III of the periodic table.

45. A photoconductive member according to claim 44, wherein the atom belonging to the group III of the periodic table is selected from among B, Al, Ga, In and Tl.

46. A photoconductive member according to claim 43, wherein the substance (C) for controlling conductivity is an atom belonging to the group V of the periodic table.

47. A photoconductive member according to claim 46, wherein the atom belonging to the group V of the periodic table is selected from among P, As, Sb and Bi.

48. A photoconductive member according to claim 43, wherein the content of the substance (C) for controlling conductivity in the first layer (I) is 0.01 to $5 \times 10^4$ atomic ppm.

49. A photoconductive member according to claim 33, wherein a substance (C) for controlling conductivity is contained in the first layer region (G).

50. A photoconductive member according to claim 49, wherein the content of the substance (C) for controlling conductivity in the first layer region (G) is 0.01 to $5 \times 10^4$ atomic ppm.

51. A photoconductive member according to claim 3, wherein a substance (C) for controlling conductivity is contained in the second layer region (S).

52. A photoconductive member according to claim 1, wherein the content of the substance (C) for controlling conductivity in the second layer region (S) is 0.001 to 1000 atomic ppm.

53. A photoconductive member according to claim 33, wherein 0.01 to 40 atomic % of hydrogen atoms are contained in the first layer region (G).

54. A photoconductive member according to claim 33, wherein 0.01 to 40 atomic % of halogen atoms are contained in the first layer region (G).

55. A photoconductive member according to claim 33, wherein 0.01 to 40 atomic % as the total of hydrogen atoms and halogen atoms are contained in the first layer region (G).

56. A photoconductive member according to claim 33, wherein 1 to 40 atomic % of hydrogen atoms are contained in the second layer region (S).

57. A photoconductive member according to claim 33, wherein 1 to 40 atomic % of halogen atoms are contained in the second layer region (S).

58. A photoconductive member according to claim 33, wherein 1 to 40 atomic % as the total of hydrogen atoms and halogen atoms are contained in the second layer region (S).

59. A photoconductive member according to claim 33, wherein the first layer (I) has a layer region (PN) containing a substance (C) for controlling conductivity.

60. A photoconductive member according to claim 59, wherein the layer region (PN) is provided as the end portion layer region on the substrate side of the light receiving layer.

61. A photoconductive member according to claim 59, wherein the layer region (PN) has the bonded interface between the first layer region (G) and the second layer region (S) in its inner portion.

62. A photoconductive member according to claim 59, wherein the layer region (PN) is provided in the second layer region (S).

63. A photoconductive member according to claim 59, wherein the layer region (PN) is provided in the layer region (G).

64. A photoconductive member according to claim 59, wherein the content of the substance (C) for controlling conductivity in the layer region (PN) is 0.01 to $5 \times 10^4$ atomic ppm.

65. A photoconductive member according to claim 33, wherein the amorphous material constituting the second layer (II) is an amorphous material represented by the following formula:

$$a\text{-}(Si_xC_{1-x})_y(H,X)_{1-y}$$

(where $0<x$, $y<1$).

66. A photoconductive member according to claim 33, wherein the amorphous material constituting the second layer (II) is an amorphous material represented by the following formula:

$$a\text{-}(Si_xO_{1-x})_y(H,X)_{1-y}$$

(where $0<x$, $y<1$).

67. A photoconductive member according to claim 33, wherein the second layer (II) has a layer thickness of 0.003 to 30$\mu$.

68. An electrophotographic process comprising:
applying a charge to the photoconductive member of claim 1, and
irradiating the charged photoconductive member with an electromagnetic wave carrying information, thereby forming an electrostatic image on the photoconductive member.

69. An electrophotographic process comprising:
applying a charge to the photoconductive member of claim 33, and
irradiating the charged photoconductive member with an electromagnetic wave carrying information, thereby forming an electrostatic image on the photoconductive member.

* * * * *

UNITED STATES PATENT AND TRADEMARK OFFICE
CERTIFICATE OF CORRECTION

PATENT NO. : 4,585,721
DATED : April 29, 1986
INVENTOR(S) : KEISHI SAITOH, ET AL.

Page 1 of 2

It is certified that error appears in the above-identified patent and that said Letters Patent is hereby corrected as shown below:

COLUMN 7

Line 21, change "$C_9$between" to --$C_9$ between--.

Line 28, change "$t_B$to" to --$t_B$ to--.

COLUMN 43

Line 48, change "$NH_3/(SiH_4 + SiH_4) = 3/100$" to --$NH_3/(GeH_4 + SiH_4) = 3/100$--.

Line 64, change "$NH_3/(SiH_4 + SiH_4) = 3/100$" to --$NH_3/(GeH_4 + SiH_4) = 3/100$--.

COLUMN 51

Line 59, delete ":Good".

COLUMN 59

Lines 47-49, change "$B_2H_6/He = 10^{-3}$ $SiH_4/He = 0.5$ $NH_3$" to --$SiH_4/He = 0.5$ $NH_3$ $B_2H_6/He - 10^{-3}$--.

Line 59, delete "○ ◎ ◎ ◎ ○○○".

Line 68, change "Second" to --Second Layer--.

COLUMN 64

Line 68, change "◎" to --○--.

UNITED STATES PATENT AND TRADEMARK OFFICE
CERTIFICATE OF CORRECTION

PATENT NO. : 4,585,721

DATED : April 29, 1986

INVENTOR(S) : KEISHI SAITOH, ET AL.

It is certified that error appears in the above-identified patent and that said Letters Patent is hereby corrected as shown below:

COLUMN 69

Line 8, change "$B_2H_6SiH_4$" to --$B_2H_6/SiH_4$--.

COLUMN 71

Line 12, change "0.0002" to --0.0001--.

COLUMN 72

Line 53, change " 1 x 105" to --1 x $10^5$--.

COLUMN 73

Line 59, change "is" to --as--.

COLUMN 75

Line 23, change "claim 3" to -- claim 33 --.
Line 26, change "claim 1" to -- claim 51 --.

Signed and Sealed this

Twenty-eighth Day of April, 1987

Attest:

DONALD J. QUIGG

Attesting Officer

Commissioner of Patents and Trademarks